(12) United States Patent
Senzai et al.

(10) Patent No.: US 8,951,843 B2
(45) Date of Patent: Feb. 10, 2015

(54) LAMINATED SHEET AND METHOD OF MANUFACTURING SEMICONDUCTOR DEVICE USING THE LAMINATED SHEET

(71) Applicant: Nitto Denko Corporation, Ibaraki-shi, Osaka (JP)

(72) Inventors: Hiroyuki Senzai, Ibaraki (JP); Shumpei Tanaka, Ibaraki (JP); Koji Mizuno, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 233 days.

(21) Appl. No.: 13/712,707

(22) Filed: Dec. 12, 2012

(65) Prior Publication Data
US 2013/0149842 A1   Jun. 13, 2013

(30) Foreign Application Priority Data

Dec. 12, 2011   (JP) ................. 2011-271279
Dec. 12, 2011   (JP) ................. 2011-271282

(51) Int. Cl.
| | | |
|---|---|---|
| *H01L 21/00* | (2006.01) | |
| *B23B 3/30* | (2006.01) | |
| *H01L 21/78* | (2006.01) | |
| *H01L 21/683* | (2006.01) | |
| *C09J 7/02* | (2006.01) | |
| *H01L 23/00* | (2006.01) | |

(52) U.S. Cl.
CPC . *B23B 3/30* (2013.01); *H01L 21/78* (2013.01); *H01L 21/6836* (2013.01); *C09J 7/02* (2013.01); *H01L 24/27* (2013.01); *H01L 24/29* (2013.01); *H01L 2221/68327* (2013.01); *H01L 2221/6834* (2013.01); *H01L 2221/68377* (2013.01); *H01L 2221/68381* (2013.01); *H01L 2221/68386* (2013.01); *C09J 2201/36* (2013.01); *C09J 2201/606* (2013.01); *C09J 2201/61* (2013.01); *C09J 2201/622* (2013.01); *C09J 2203/326* (2013.01); *C09J 2463/00* (2013.01);
(Continued)

(58) Field of Classification Search
CPC ............................................. H01L 2221/68327
USPC .......................................................... 438/113
See application file for complete search history.

(56) References Cited

U.S. PATENT DOCUMENTS

| 5,863,815 A | 1/1999 | Egawa |
|---|---|---|
| 5,994,168 A | 11/1999 | Egawa |

(Continued)

FOREIGN PATENT DOCUMENTS

| JP | 09213741 | 8/1997 |
|---|---|---|
| JP | 10242208 | 9/1998 |

(Continued)

*Primary Examiner* — Ha Tran T Nguyen
*Assistant Examiner* — Aaron Dehne
(74) *Attorney, Agent, or Firm* — Alleman Hall McCoy Russell & Tuttle LLP

(57) ABSTRACT

The present invention provides a laminated sheet that can prevent the decrease in adhering strength of a resin composition layer and the deterioration in electrical reliability and in which a back grinding tape can be peeled from a plurality of semiconductor elements collectively after dicing. The laminated sheet has a back grinding tape in which a pressure-sensitive adhesive layer is formed on a base, and a resin composition layer that is provided on the pressure-sensitive adhesive layer of the back grinding tape, wherein the tensile modulus of the pressure-sensitive adhesive layer at 23° C. is 0.1 to 5.0 MPa, and the T-peeling strength between the pressure-sensitive adhesive layer and the resin composition layer is 0.1 to 5 N/20 mm at 23° C. and 300 mm/min.

3 Claims, 8 Drawing Sheets

(52) U.S. Cl.
CPC ............... *H01L 24/81* (2013.01); *H01L 24/83* (2013.01); *H01L 2224/13111* (2013.01); *H01L 2224/13144* (2013.01); *H01L 2224/13147* (2013.01); *H01L 2224/27436* (2013.01); *H01L 2224/29023* (2013.01); *H01L 2224/2919* (2013.01); *H01L 2224/73104* (2013.01); *H01L 2224/73204* (2013.01); *H01L 2224/81191* (2013.01); *H01L 2224/81203* (2013.01); *H01L 2224/83191* (2013.01); *H01L 2224/83203* (2013.01); *H01L 2224/83855* (2013.01); *H01L 2224/9211* (2013.01); *H01L 2224/94* (2013.01); *H01L 2224/16227* (2013.01); *H01L 2224/16245* (2013.01); *H01L 2224/32225* (2013.01); *H01L 2224/32245* (2013.01)
USPC ............................................ 438/113; 438/114

(56) References Cited

U.S. PATENT DOCUMENTS

| | | | |
|---|---|---|---|
| 2010/0178501 A1* | 7/2010 | Masuko et al. | 428/355 N |
| 2010/0279491 A1* | 11/2010 | Kiuchi et al. | 438/464 |
| 2010/0317155 A1* | 12/2010 | Kang et al. | 438/113 |
| 2011/0030881 A1* | 2/2011 | Sasaki et al. | 156/153 |
| 2011/0097576 A1* | 4/2011 | Habu et al. | 428/336 |
| 2012/0202036 A1* | 8/2012 | Kim et al. | 428/220 |

FOREIGN PATENT DOCUMENTS

| | | |
|---|---|---|
| JP | 10270497 | 10/1998 |
| JP | 2002118147 | 4/2002 |
| JP | 2008130588 | 6/2008 |

* cited by examiner

LAMINATED SHEET AND METHOD OF MANUFACTURING SEMICONDUCTOR DEVICE USING THE LAMINATED SHEET

BACKGROUND OF THE INVENTION

1. Field of the Invention

The present invention relates to a laminated sheet and a method of manufacturing a semiconductor device using the laminated sheet.

2. Description of the Related Art

In recent years, thinning and downsizing of a semiconductor device and its packaging have been further required. Because of that, a flip-chip semiconductor device, in which a semiconductor element such as a semiconductor chip is mounted on a substrate by flip-chip bonding, has been widely used for semiconductor devices and their packaging. In flip-chip bonding, a circuit surface of a semiconductor chip is fixed to an electrode forming surface of the substrate in such a way that the circuit surface is facing the electrode forming surface.

After flip-chip bonding, a space is formed between the semiconductor element and the substrate, and the space has been conventionally filled with a sealing material such as a sealing resin. However, there is a problem that a long process time is required because the space between the semiconductor element and the substrate is generally narrow and it is difficult to impregnate a liquid sealing material in the space without generating voids.

A method is disclosed in, for example, JP-A-9-213741, JP-A-10-242208, and JP-A-10-270497 of using an adhesive film as a sealing material and adhering a semiconductor element and a substrate via the adhesive film therebetween to seal the space between the semiconductor element and the substrate conveniently and securely.

Due to the requirement for thinning and downsizing of a semiconductor device and its packaging, a semiconductor element has been conventionally ground thin. A method of manufacturing a semiconductor device is disclosed in JP-A-2002-118147 and JP-A-2008-130588, including the steps of grinding a semiconductor element thin and sealing a space between the semiconductor element and the substrate using an adhesive film.

SUMMARY OF THE INVENTION

A method of mounting a semiconductor chip to a printed circuit board is disclosed in JP-A-2002-118147, including the following steps [a] to [g]: [a] manufacturing a sheet for mounting a semiconductor chip in which a thermosetting resin layer is provided on one surface of a synthetic resin film, [b] press bonding the thermosetting resin layer of the sheet for mounting a semiconductor chip onto a surface where bump electrodes of a semiconductor wafer are provided, [c] grinding the backside of the semiconductor wafer on which the sheet for mounting a semiconductor chip is press bonded to obtain the desired thickness of the semiconductor wafer, [d] dicing into individual pieces the semiconductor wafer of which the backside is ground with the sheet for mounting a semiconductor chip being press bonded, [e] peeling the synthetic resin film of the sheet for mounting a semiconductor chip that is press bonded onto the bump electrode surface of the semiconductor chip that is obtained by dicing, [f] determining the position of the bump electrodes of the semiconductor chip so that they are correctly facing and contacting the corresponding terminals on the printed circuit board, and [g] bonding the bump electrodes of the semiconductor chip to the corresponding terminals on the printed circuit board and thermally curing the thermosetting resin.

In JP-A-2002-118147, the semiconductor wafer is diced into individual pieces with the sheet for mounting a semiconductor chip being press bonded ([d]), and then the synthetic resin film is peeled off the sheet for mounting a semiconductor chip that is press bonded onto the bump electrode surface of the semiconductor chip that is obtained by dicing. However, greater man-hours are required because the synthetic resin film that is also diced into individual pieces cannot be peeled from a plurality of the semiconductor chips collectively and has to be peeled individually.

A method of manufacturing an electronic device system is disclosed in JP-A-2008-130588, using an electronic device substrate having a plurality of electronic elements that are not electrically connected to each other, electrodes, and an adhesive composition for a semiconductor that is formed on the surface where the electrodes are formed, and having a plastic film that is laminated onto the adhesive composition for a semiconductor. In this production method, a pressure-sensitive adhesive layer is formed on the adhesive composition for a semiconductor of the electronic device substrate, the surface of the electronic device wafer where electronic elements are not formed is polished, the plastic film is peeled, then the wafer is diced into individual pieces, an individualized electronic element with the adhesive composition for a semiconductor is mounted on a circuit board, and the electrodes formed on the electronic element and the electrodes on the circuit board are directly contacted to each other to be electrically connected.

However, the plastic film is peeled, and then dicing is performed in JP-A-2008-130588. That is, dicing is performed while the adhesive composition for a semiconductor is exposed. Because of that, water is absorbed by the adhesive composition for a semiconductor during dicing, and it causes a generation of space and voids in a layer of the adhesive composition for a semiconductor during flip-chip mounting. In addition, cut scraps may be attached. Because of these, a decrease in adhering strength and a deterioration in electrical reliability may occur.

The present invention has been made in view of the above-described problems, and an object thereof is to provide a laminated sheet that can prevent the decrease in adhering strength of the resin composition layer and the deterioration in electrical reliability, and in which a back grinding tape can be peeled from a plurality of semiconductor elements collectively after dicing, and a method of manufacturing a semiconductor device using the laminated sheet.

The present inventors have investigated a laminated sheet and a method of manufacturing a semiconductor device using the laminated sheet to solve the conventional problems. As a result, it has been found that a laminated sheet may be used, which has a back grinding tape in which a pressure-sensitive adhesive layer is formed on a base, and a resin composition layer that is provided on the pressure-sensitive adhesive layer of the back grinding tape, wherein the tensile modulus of the pressure-sensitive adhesive layer is in a specific range and the T-peeling strength between the pressure-sensitive adhesive layer and the resin composition layer is in a specific range, to thereby make it possible to prevent a decrease in adhering strength and a deterioration in electrical reliability and to peel the back grinding tape from a plurality of semiconductor elements collectively after dicing.

Accordingly, a laminated sheet according to a first aspect of the present invention has a back grinding tape in which a pressure-sensitive adhesive layer is formed on a base, and a resin composition layer that is provided on the pressure-sensitive adhesive layer of the back grinding tape, wherein the tensile modulus of the pressure-sensitive adhesive layer at 23° C. is 0.1 to 5.0 MPa, and the T-peeling strength between the pressure-sensitive adhesive layer and the resin composition layer is 0.1 to 5 N/20 mm at 23° C. and 300 mm/min.

The laminated sheet is used in a method of manufacturing a semiconductor device including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, pasting a pressure-sensitive adhesive tape to the laminated sheet after dicing, and peeling the pressure-sensitive adhesive tape from the resin composition layer together with the back grinding tape.

According to the laminated sheet, because dicing is performed while the back grinding tape is pasted onto the resin composition layer as described above, the absorption of water by the resin composition layer during dicing and the attachment of cut scraps to the resin composition layer can be suppressed. As a result, the decrease in adhering strength of the resin composition layer and the deterioration in electrical reliability can be prevented. Because the T-peeling strength between the pressure-sensitive adhesive layer and the resin composition layer is 0.1 N/20 mm or more at 23° C. and 300 mm/min, chip flying from the back grinding tape during dicing can be suppressed. Because the T-peeling strength is 5 N/20 mm or less, the pressure-sensitive adhesive tape can be peeled from the resin composition layer together with the back grinding tape collectively. Because the tensile modulus of the pressure-sensitive adhesive layer at 23° C. is 0.1 MPa or more, chip flying from the back grinding tape during dicing can be suppressed. Because the tensile modulus of the pressure-sensitive adhesive layer is 5.0 MPa or less, the pressure-sensitive adhesive tape can be peeled from the resin composition layer together with the back grinding tape collectively.

In the above-described configuration, the resin composition layer preferably contains a thermosetting resin. When the resin composition layer contains a thermosetting resin, it can be used as a sealing material between the semiconductor element and an adherend when the semiconductor element is flip-chip mounted.

In the above-described configuration, the thermosetting resin is preferably an epoxy resin.

A method of manufacturing a semiconductor device according to the first aspect uses a laminated sheet having a back grinding tape in which a pressure-sensitive adhesive layer is formed on a base, and a resin composition layer that is provided on the pressure-sensitive adhesive layer of the back grinding tape, in which the tensile modulus of the pressure-sensitive adhesive layer at 23° C. is 0.1 to 5.0 MPa, and the T-peeling strength between the pressure-sensitive adhesive layer and the resin composition layer is 0.1 to 5 N/20 mm at 23° C. and 300 mm/min, the method including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, pasting a pressure-sensitive adhesive tape to the laminated sheet after dicing, and peeling the pressure-sensitive adhesive tape from the resin composition layer together with the back grinding tape.

Because dicing is performed while the back grinding tape is pasted onto the resin composition layer according to the method of manufacturing a semiconductor device of the first aspect, the absorption of water by the resin composition layer during dicing and the attachment of the cut scraps to the resin composition layer can be suppressed. As a result, the decrease in adhering strength of the resin composition layer and the deterioration in electrical reliability can be prevented. Because the T-peeling strength between the pressure-sensitive adhesive layer and the resin composition layer is 0.1 N/20 mm or more at 23° C. and 300 mm/min, chip flying from the back grinding tape during dicing can be suppressed. Because the T-peeling strength is 5 N/20 mm or less, the pressure-sensitive adhesive tape can be peeled from the resin composition layer together with the back grinding tape collectively. Because the tensile modulus of the pressure-sensitive adhesive layer at 23° C. is 0.1 MPa or more, chip flying from the back grinding tape during dicing can be suppressed. Because the tensile modulus of the pressure-sensitive adhesive layer is 5.0 MPa or less, the pressure-sensitive adhesive tape can be peeled from the resin composition layer together with the back grinding tape collectively.

In the above-described configuration, the resin composition layer preferably contains a thermosetting resin. When the resin composition layer contains a thermosetting resin, it can be used as a sealing material between the semiconductor element and an adherend when the semiconductor element is flip-chip mounted.

In the above-described configuration, the thermosetting resin is preferably an epoxy resin.

A laminated sheet according to a second aspect of the present invention has a back grinding tape in which a pressure-sensitive adhesive layer is formed on a base, and a resin composition layer that is provided on the pressure-sensitive adhesive layer of the back grinding tape, wherein the pressure-sensitive adhesive layer is a radiation curable-type pressure-sensitive adhesive layer, the tensile modulus of the pressure-sensitive adhesive layer before radiation curing at 23° C. is 0.1 to 5.0 MPa, the T-peeling strength between the pressure-sensitive adhesive layer and the resin composition layer before radiation curing is 0.1 to 20 N/20 mm at 23° C. and 300 mm/min, and the T-peeling strength between the pressure-sensitive adhesive layer and the resin composition layer after radiation curing is 0.01 to 5 N/20 mm at 23° C. and 300 mm/min.

The laminated sheet is used in any of the following methods (1) to (4) of manufacturing a semiconductor device.

(1) A method of manufacturing a semiconductor device including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, pasting a pressure-sensitive adhesive tape to the laminated sheet after dicing, and peeling the pressure-sensitive adhesive tape from the resin composition layer together with the back grinding tape.

(2) A method of manufacturing a semiconductor device including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, irradiating the laminated sheet side with radiation after dicing, pasting a pressure-sensitive adhesive tape to the laminated sheet after irradiating with radiation, and peeling the pressure-sensitive adhesive tape from the resin composition layer together with the back grinding tape.

(3) A method of manufacturing a semiconductor device including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, pasting a pressure-sensitive adhesive tape to the laminated sheet after dicing, irradiating the laminated sheet side with radiation after pasting of the pressure-sensitive adhesive tape, and peeling the pressure-sensitive adhesive tape from the resin composition layer together with the back grinding tape.

(4) A method of manufacturing a semiconductor device including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, irradiating the laminated sheet side with radiation after dicing, pasting a pressure-sensitive adhesive tape to the laminated sheet after irradiating with radiation, irradiating the laminated sheet side with radiation after pasting of the pressure-sensitive adhesive tape, and peeling the pressure-sensitive adhesive tape from the resin composition layer together with the back grinding tape.

According to the laminated sheet, because dicing is performed while the back grinding tape is pasted onto the resin composition layer as described above, the absorption of water by the resin composition layer during dicing and the attachment of the cut scraps to the resin composition layer can be suppressed. As a result, the decrease in adhering strength of the resin composition layer and the deterioration in electrical reliability can be prevented. Because the T-peeling strength between the pressure-sensitive adhesive layer and the resin composition layer before radiation curing is 0.1 N/20 mm or more at 23° C. and 300 mm/min, chip flying from the back grinding tape during dicing can be suppressed. Because the T-peeling strength after radiation curing is 5 N/20 mm or less, the pressure-sensitive adhesive tape can be peeled from the resin composition layer together with the back grinding tape collectively. Because the tensile modulus of the pressure-sensitive adhesive layer after radiation curing at 23° C. is 0.1 MPa or more and 5.0 MPa or less, the pressure-sensitive adhesive tape can be peeled from the resin composition layer together with the back grinding tape collectively.

In the above-described configuration, the resin composition layer preferably contains a thermosetting resin. When the resin composition layer contains a thermosetting resin, it can be used as a sealing material between the semiconductor element and an adherend when the semiconductor element is flip-chip mounted.

In the above-described configuration, the thermosetting resin is preferably an epoxy resin.

A method of manufacturing a semiconductor device according to the second aspect uses a laminated sheet having a back grinding tape in which a pressure-sensitive adhesive layer is formed on a base, and a resin composition layer that is provided on the pressure-sensitive adhesive layer of the back grinding tape, in which the pressure-sensitive adhesive layer is a radiation-curable type pressure-sensitive adhesive layer, the tensile modulus of the pressure-sensitive adhesive layer before radiation curing at 23° C. is 0.1 to 5.0 MPa, and the T-peeling strength between the pressure-sensitive adhesive layer and the resin composition layer before radiation curing is 0.1 to 5 N/20 mm at 23° C. and 300 mm/min, the method including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, pasting a pressure-sensitive adhesive tape to the laminated sheet after dicing, and peeling the pressure-sensitive adhesive tape from the resin composition layer together with the back grinding tape.

Because dicing is performed while the back grinding tape is pasted onto the resin composition layer according to the method of manufacturing a semiconductor device of the second aspect, the absorption of water by the resin composition layer during dicing and the attachment of the cut scraps to the resin composition layer can be suppressed. As a result, the decrease in adhering strength of the resin composition layer and the deterioration in electrical reliability can be prevented. Because the T-peeling strength between the pressure-sensitive adhesive layer and the resin composition layer is 0.1 N/20 mm or more at 23° C. and 300 mm/min, chip flying from the back grinding tape during dicing can be suppressed. Because the T-peeling strength is 5 N/20 mm or less, the pressure-sensitive adhesive tape can be peeled from the resin composition layer together with the back grinding tape collectively. Because the tensile modulus of the pressure-sensitive adhesive layer before radiation curing at 23° C. is 0.1 MPa or more, chip flying from the back grinding tape during dicing can be suppressed. Because the tensile modulus of the pressure-sensitive adhesive layer before radiation curing is 5.0 MPa or less, the pressure-sensitive adhesive tape can be peeled from the resin composition layer together with the back grinding tape collectively.

In the above-described configuration, the resin composition layer preferably contains a thermosetting resin. When the resin composition layer contains a thermosetting resin, it can be used as a sealing material between the semiconductor element and an adherend when the semiconductor element is flip-chip mounted.

In the above-described configuration, the thermosetting resin is preferably an epoxy resin.

The method of manufacturing a semiconductor device according to the second aspect uses a laminated sheet having a back grinding tape in which a pressure-sensitive adhesive layer is formed on a base, and a resin composition layer that is provided on the pressure-sensitive adhesive layer of the back grinding tape, in which the pressure-sensitive adhesive layer is a radiation-curable type pressure-sensitive adhesive layer, the tensile modulus of the pressure-sensitive adhesive layer before radiation curing at 23° C. is 0.1 to 5.0 MPa, the T-peeling strength between the pressure-sensitive adhesive layer and the resin composition layer before radiation curing is 0.1 to 20 N/20 mm at 23° C. and 300 mm/min, and the T-peeling strength between the pressure-sensitive adhesive layer and the resin composition layer after radiation curing is 0.01 to 5 N/20 mm at 23° C. and 300 mm/min, the method including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, irradiating the laminated sheet side with radiation after dicing, pasting a pressure-sensitive adhesive tape to the laminated sheet after irradiating with radiation, and peeling the pressure-sensitive adhesive tape from the resin composition layer together with the back grinding tape.

Because dicing is performed while the back grinding tape is pasted onto the resin composition layer according to the method of manufacturing a semiconductor device of the second aspect, the absorption of water by the resin composition layer during dicing and the attachment of the cut scraps to the resin composition layer can be suppressed. As a result, the decrease in adhering strength of the resin composition layer and the deterioration in electrical reliability can be prevented. Because the T-peeling strength between the pressure-sensitive adhesive layer and the resin composition layer before radiation curing is 0.1 N/20 mm or more at 23° C. and 300 mm/min, chip flying from the back grinding tape during dicing can be suppressed. Because the T-peeling strength after radiation curing is 5 N/20 mm or less, the pressure-sensitive adhesive tape can be peeled from the resin composition layer together with the back grinding tape collectively. Because the tensile modulus of the pressure-sensitive adhesive layer before radiation curing at 23° C. is 0.1 MPa or more, chip flying from the back grinding tape during dicing can be suppressed. Because the tensile modulus of the pressure-sensitive adhesive layer before radiation curing at 23° C. is 5.0 MPa or less, the irradiating amount is controlled to make the tensile modulus after radiation curing at 23° C. be 0.1 MPa or more and 5.0 MPa or less. As a result, the pressure-sensitive adhesive tape can be peeled from the resin composition layer together with the back grinding tape collectively.

In the above-described configuration, the resin composition layer preferably contains a thermosetting resin. When the resin composition layer contains a thermosetting resin, it can be used as a sealing material between the semiconductor element and an adherend when the semiconductor element is flip-chip mounted.

In the above-described configuration, the thermosetting resin is preferably an epoxy resin.

The method of manufacturing a semiconductor device according to the second aspect uses a laminated sheet having a back grinding tape in which a pressure-sensitive adhesive layer is formed on a base, and a resin composition layer that is provided on the pressure-sensitive adhesive layer of the back grinding tape, in which the pressure-sensitive adhesive layer is a radiation-curable type pressure-sensitive adhesive layer, the tensile modulus of the pressure-sensitive adhesive layer before radiation curing at 23° C. is 0.1 to 5.0 MPa, the T-peeling strength between the pressure-sensitive adhesive layer and the resin composition layer before radiation curing is 0.1 to 20 N/20 mm at 23° C. and 300 mm/min, and the T-peeling strength between the pressure-sensitive adhesive layer and the resin composition layer after radiation curing is 0.01 to 5 N/20 mm at 23° C. and 300 mm/min, the method including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, pasting a pressure-sensitive adhesive tape to the laminated sheet after dicing, irradiating the laminated sheet side with radiation after pasting of the pressure-sensitive adhesive tape, and peeling the pressure-sensitive adhesive tape from the resin composition layer together with the back grinding tape.

Because dicing is performed while the back grinding tape is pasted onto the resin composition layer according to the method of manufacturing a semiconductor device, the absorption of water by the resin composition layer during dicing and the attachment of the cut scraps to the resin composition layer can be suppressed. As a result, the decrease in adhering strength of the resin composition layer and the deterioration in electrical reliability can be prevented. Because the T-peeling strength between the pressure-sensitive adhesive layer and the resin composition layer before radiation curing is 0.1 N/20 mm or more at 23° C. and 300 mm/min, chip flying from the back grinding tape during dicing can be suppressed. Because the T-peeling strength after radiation curing is 5 N/20 mm or less, the pressure-sensitive adhesive tape can be peeled from the resin composition layer together with the back grinding tape collectively. Because the tensile modulus of the pressure-sensitive adhesive layer before radiation curing at 23° C. is 0.1 MPa or more, chip flying from the back grinding tape during dicing can be suppressed. Because the tensile modulus of the pressure-sensitive adhesive layer before radiation curing at 23° C. is 5.0 MPa or less, the irradiating amount is controlled to make the tensile modulus after radiation curing at 23° C. be 0.1 MPa or more and 5.0

MPa or less. As a result, the pressure-sensitive adhesive tape can be peeled from the resin composition layer together with the back grinding tape collectively.

In the above-described configuration, the resin composition layer preferably contains a thermosetting resin. When the resin composition layer contains a thermosetting resin, it can be used as a sealing material between the semiconductor element and an adherend when the semiconductor element is flip-chip mounted.

In the above-described configuration, the thermosetting resin is preferably an epoxy resin.

The method of manufacturing a semiconductor device according to the second aspect uses a laminated sheet having aback grinding tape in which a pressure-sensitive adhesive layer is formed on a base, and a resin composition layer that is provided on the pressure-sensitive adhesive layer of the back grinding tape, in which the pressure-sensitive adhesive layer is a radiation-curable type pressure-sensitive adhesive layer, the tensile modulus of the pressure-sensitive adhesive layer before radiation curing at 23° C. is 0.1 to 5.0 MPa, the T-peeling strength between the pressure-sensitive adhesive layer and the resin composition layer before radiation curing is 0.1 to 20 N/20 mm at 23° C. and 300 mm/min, and the T-peeling strength between the pressure-sensitive adhesive layer and the resin composition layer after radiation curing is 0.01 to 5 N/20 mm at 23° C. and 300 mm/min, the method including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, irradiating the laminated sheet side with radiation after dicing, pasting a pressure-sensitive adhesive tape to the laminated sheet after irradiating with radiation, irradiating the laminated sheet side with radiation after pasting of the pressure-sensitive adhesive tape, and peeling the pressure-sensitive adhesive tape from the resin composition layer together with the back grinding tape.

Because dicing is performed while the back grinding tape is pasted onto the resin composition layer according to the method of manufacturing a semiconductor device of the present invention, the absorption of water by the resin composition layer during dicing and the attachment of the cut scraps to the resin composition layer can be suppressed. As a result, the decrease in adhering strength of the resin composition layer and the deterioration in electrical reliability can be prevented. Because the T-peeling strength between the pressure-sensitive adhesive layer and the resin composition layer before radiation curing is 0.1 N/20 mm or more at 23° C. and 300 mm/min, chip flying from the back grinding tape during dicing can be suppressed. Because the T-peeling strength after radiation curing is 5 N/20 mm or less, the pressure-sensitive adhesive tape can be peeled from the resin composition layer together with the back grinding tape collectively. Because the tensile modulus of the pressure-sensitive adhesive layer before radiation curing at 23° C. is 0.1 MPa or more, chip flying from the back grinding tape during dicing can be suppressed. Because the tensile modulus of the pressure-sensitive adhesive layer before radiation curing at 23° C. is 5.0 MPa or less, the irradiating amount is controlled to make the tensile modulus after radiation curing at 23° C. be 0.1 MPa or more and 5.0 MPa or less. As a result, the pressure-sensitive adhesive tape can be peeled from the resin composition layer together with the back grinding tape collectively.

In the above-described configuration, the resin composition layer preferably contains a thermosetting resin. When the resin composition layer contains a thermosetting resin, it can be used as a sealing material between the semiconductor element and an adherend when the semiconductor element is flip-chip mounted.

In the above-described configuration, the thermosetting resin is preferably an epoxy resin.

According to the present invention, a laminated sheet can be provided that can prevent the decrease in adhering strength of the resin composition layer and the deterioration in electrical reliability and in which a back grinding tape can be peeled from a plurality of semiconductor elements collectively after dicing, and a method of manufacturing a semiconductor device using the laminated sheet can be provided.

Figure 1:
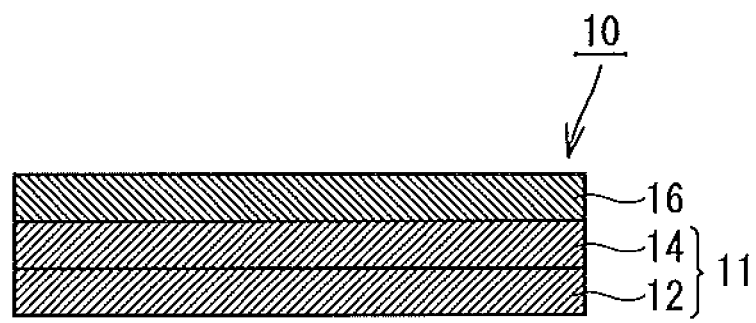
FIG. 1 is a schematic sectional view showing a laminated sheet according to one embodiment of a first aspect.

EXPLANATION OF THE REFERENCE NUMERALS 10, 100 Laminated Sheet
11, 110 Back Grinding Tape
12, 120 Base
14, 140 Pressure-Sensitive Adhesive Layer
16, 160 Resin Composition Layer
20, 200 Dicing Tape
30, 300 Pressure-Sensitive Adhesive Tape
40, 400 Semiconductor Taper
42, 420 Semiconductor Chip

DETAILED DESCRIPTION OF THE PREFERRED EMBODIMENTS

<First Aspect>

An embodiment of a first aspect of the present invention is described referring to the drawings. However, the first aspect is not limited to these examples. FIG. 1 is a schematic sectional view showing a laminated sheet according to one embodiment of the first aspect. In the drawings, the parts are omitted that are unnecessary for the description, and some parts are enlarged, shrunken, and the like in order to aid in the description.

<Laminated Sheet>

A laminated sheet 10 has a back grinding tape 11 in which a pressure-sensitive adhesive layer 14 is formed on a base 12, and a resin composition layer 16 is provided on the pressure-sensitive adhesive layer 14 of the back grinding tape 11.

The laminated sheet 10, in which the pressure-sensitive adhesive layer 14 is formed with a general pressure-sensitive adhesive, is used in a method of manufacturing a semiconductor device including the following steps.

Figure 2:
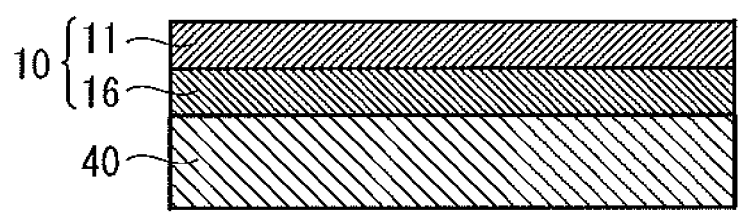
FIG. 2 is a schematic sectional view showing one example of a method of manufacturing a semiconductor device using the laminated sheet shown in FIG. 1.
Figure 6:
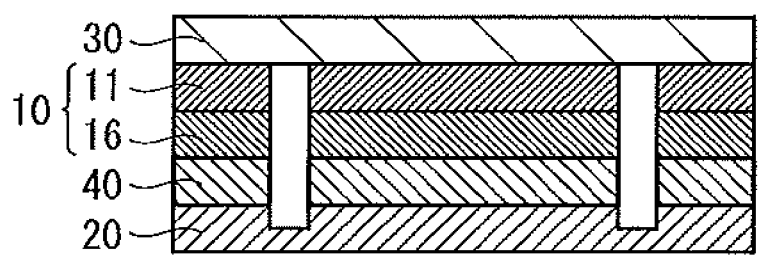
FIG. 6 is a schematic sectional view showing one example of a method of manufacturing a semiconductor device using the laminated sheet shown in FIG. 1.
Figure 7:
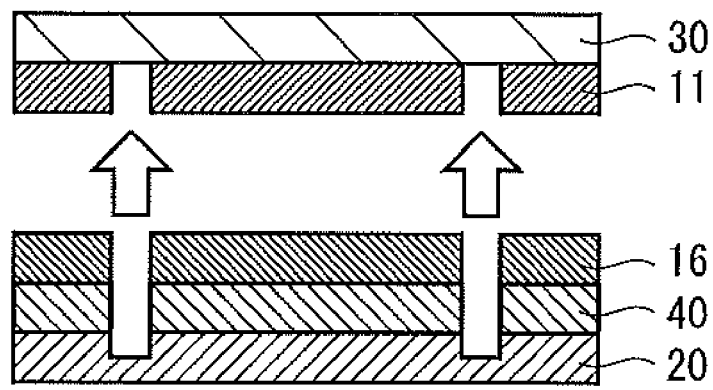
FIG. 7 is a schematic sectional view showing one example of a method of manufacturing a semiconductor device using the laminated sheet shown in FIG. 1.

The method of manufacturing a semiconductor device includes the steps of pasting the resin composition layer 16 surface of the laminated sheet 10 to the circuit surface of a semiconductor wafer 40 to obtain the semiconductor wafer 40 with the laminated sheet 10 (refer to FIG. 2), grinding the surface, where the laminated sheet 10 of the semiconductor wafer 40 with the laminated sheet 10 is not pasted, to make the semiconductor wafer 40 with the laminated sheet 10 thin (refer to FIG. 3), pasting a dicing tape 20 onto the ground surface of the thin semiconductor wafer 40 with the laminated sheet 10 to obtain the semiconductor wafer 40 in which the dicing tape 20 and the laminated sheet 10 are pasted together (refer to FIG. 4), dicing the semiconductor wafer 40 in which the dicing tape 20 and the laminated sheet 10 are pasted together from the laminated sheet 10 side (refer to FIG. 5), pasting a pressure-sensitive adhesive tape 30 to the laminated sheet 10 after dicing (refer to FIG. 6), and peeling the pressure-sensitive adhesive tape 30 from the resin composition layer 16 together with the back grinding tape 11 (refer to FIG. 7).

(Base)

(Meth) acrylic acid refers to an acrylic acid and/or a methacrylic acid, and hereinafter, every occurrence of (meth) in the present application has the same meaning. A base 12 serves as a strength base of the laminated sheet 10. Examples thereof include polyolefin such as low-density polyethylene, straight chain polyethylene, intermediate-density polyethylene, high-density polyethylene, very low-density polyethylene, polypropylene random copolymer, polypropylene block copolymer, homopolypropylene, polybutene, and polymethylpentene; ethylene-vinylacetate copolymer; ionomer resin; ethylene(meth)acrylic acid copolymer; ethylene(meth) acrylic acid ester copolymer; ethylene-butene copolymer; ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; fluorine resin; polyvinyl chloride; polyvinylidene chloride; cellulose resin; silicone resin; metal (foil); and paper.

Further, the material of the base 12 includes a polymer such as a cross-linked body of the above resins. The above plastic film may be unstretched, or may also be a film on which a monoaxial or a biaxial stretching treatment is performed, depending on necessity.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the base 12 in order to improve adhesiveness, holding properties, etc. with the adjacent layer. The same type or different type of base material can be appropriately selected and used as the base 12, and a base material in which a plurality of types are blended can be used depending on necessity. A conductive vapor deposition layer having a thickness of about 30 to 500 Å, containing a metal, an alloy, an oxide of these, or the like can be provided on the base 12 to impart an antistatic function. The base 12 may be a single layer or a plurality of layers of two or more. When the pressure-sensitive adhesive layer is a radiation curable-type pressure-sensitive adhesive layer, a base is suitably used as the base 12, which at least partially transmits radiation such as an x-ray, an ultraviolet ray, and an electron beam.

The thickness of the base 12 can be appropriately determined without any special limitation. The thickness is generally about to 200 μm.

(Pressure-Sensitive Adhesive Layer)

The adhesive that is used for forming the pressure-sensitive adhesive layer 14 is not especially limited, and general pressure-sensitive adhesives such as an acrylic pressure-sensitive adhesive and a rubber pressure-sensitive adhesive can be used, for example. The pressure-sensitive adhesive is preferably an acrylic pressure-sensitive adhesive containing an acrylic polymer as a base polymer for clean washing of electronic components such as a semiconductor wafer and glass, which are easily damaged by contamination, with ultrapure water or an organic solvent such as alcohol.

Specific examples of the acrylic polymers include an acrylic polymer in which acrylate is used as a main monomer component. Examples of the acrylate include alkyl acrylate (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and cycloalkyl acrylate (for example, cyclopentylester, cyclohexylester, etc.). These monomers may be used alone or two or more types may be used in combination.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl (meth)acrylate, carboxypentyl (meth) acrylate, itaconic acid, maleic acid, fumaric acid, and crotonic acid; acid anhydride monomers such as maleic anhydride, and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth) acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% or less by weight of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth) acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

Preparation of the above acrylic polymer can be produced by applying an appropriate method such as solution polymerization, emulsion polymerization, bulk polymerization, and suspension polymerization to a mixture of one or two or more kinds of component monomers for example. Since the adhesive layer preferably has a composition in which the content of low molecular weight materials is suppressed for prevention of wafer contamination, and since those in which an acrylic polymer having a weight average molecular weight of 300000 g/mol or more, particularly 400000 to 3000000 g/mol as a main component are preferable for such purpose, the adhesive can be made to be an appropriate cross-linked type adhesive, such as an adhesive with internal cross-linking, an adhesive with external cross-linking, etc.

To increase the number-average molecular weight of the base polymer such as acrylic polymer etc., an external crosslinking agent can be suitably adopted in the pressure-sensitive adhesive. The external crosslinking method is specifically a reaction method that involves adding and reacting a crosslinking agent such as a polyisocyanate compound, epoxy compound, aziridine compound, melamine crosslinking agent, urea resin, anhydrous compound, or polyamine, to a carboxyl group-containing polymer. When the external crosslinking agent is used, the amount of the crosslinking agent to be used is determined suitably depending on a balance with the base polymer to be crosslinked and applications thereof as the adhesive. Generally, the crosslinking agent is preferably incorporated in an amount of about 5 parts by weight or less based on 100 parts by weight of the base polymer. The lower limit of the crosslinking agent is preferably 0.1 parts by weight or more. The adhesive may be blended not only with the components described above but also with a wide variety of conventionally known additives such as a tackifier, and aging inhibitor, if necessary.

The thickness of the pressure-sensitive adhesive layer 14 is not particularly limited. However, it is preferably about 1 to 50 μm for preventing a chip cutting surface from being cracked and also fitting and holding the resin composition layer 16. It is more preferably 2 to 30 μm, and further preferably 5 to 25 μm.

The tensile modulus of the pressure-sensitive adhesive layer 14 at 23° C. is preferably 0.1 to 5.0 MPa, and more preferably 0.1 to 1.0 MPa. Because the tensile modulus of the pressure-sensitive adhesive layer 14 at 23° C. is 0.1 MPa or more, chip flying from the back grinding tape during dicing can be suppressed. Because the tensile modulus of the pressure-sensitive adhesive layer 14 is 5.0 MPa or less, the pressure-sensitive adhesive tape can be peeled from the resin composition layer together with the back grinding tape collectively.

The T-peeling strength between the pressure-sensitive adhesive layer 14 and the resin composition layer 16 is 0.1 to 5 N/20 mm or more, preferably 0.3 to 5.0 N/20 mm, and more preferably 0.5 to 5.0 N/20 mm, at 23° C. and 300 mm/min. Because the T-peeling strength between the pressure-sensitive adhesive layer 14 and the resin composition layer 16 is 0.1 N/20 mm or more at 23° C. and 300 mm/min, chip flying from the back grinding tape 11 during dicing can be suppressed. Because the T-peeling strength is 5 N/20 mm or less, the pressure-sensitive adhesive tape can be peeled from the resin composition layer together with the back grinding tape collectively.

(Resin Composition Layer)

When a semiconductor device is manufactured, the resin composition layer 16 is arranged on the wafer circuit surface, and has a function as a sealing resin to the circuit surface. The resin composition layer 16 is used to hold and fix a wafer during wafer grinding. When a chip is loaded on a substrate, the resin composition layer 16 is used to fill the space between the chip and a substrate for loading the chip, and to adhere the chip and the substrate together.

In the step of pasting the resin composition layer 16 to the circuit surface of the wafer, a resin that is used as the resin composition layer 16 exhibits some degree of fluidity due to heating and the press bonding force to follow the unevenness of the circuit surface, and exerts tackiness by heating in the step of pasting the resin composition layer 16 to the circuit surface of the wafer. Examples of such a resin include a B-stage resin and a pressure-sensitive adhesive.

Examples of the B-stage resin include a semi-cured epoxy resin.

Examples of the pressure-sensitive adhesive include a mixture of a binder resin having pressure-sensitive tackiness at a normal temperature, and a thermosetting resin. Examples of the binder resin having pressure-sensitive tackiness at a normal temperature include an acrylic resin, a polyester resin, polyvinylether, a urethane resin, and polyamide. Examples of the thermosetting resin include an epoxy resin, a polyimide resin, a phenol resin, a urea resin, a melamine resin, and a resorcinol resin, and preferably an epoxy resin. The thermosetting resin can be used together with an appropriate curing accelerator. Conventionally known materials can be suitably adopted as the binder resin having pressure-sensitive tackiness at a normal temperature, the thermosetting resin, and the curing accelerator.

The pressure-sensitive adhesive having components described above exhibits moderate fluidity due to heating and press bonding force, and the resin composition layer 16 can be formed that follows the unevenness of the circuit surface well. It can be used as an adhesive that adheres closely to the back grinding tape 11 to fix the wafer during wafer grinding and that adheres the chip and the substrate for loading the chip. When it is thermally cured, a cured layer with high impact resistance can be finally obtained. In addition, an excellent balance can be achieved between shear strength and peeling strength, and a sufficient adhesive property can be maintained even under a severe heat and humidity condition.

The resin composition layer 16 preferably has high visible light transmissivity to improve alignment accuracy during dicing. The visible light transmissivity of the resin composition layer 16 is preferably in a range of 70 to 99%.

The thickness ($T_A$) of the resin composition layer 16 is normally 3 to 150 μm. When bumps are formed on the wafer surface, the ratio ($H_B/T_A$) of the average height ($H_B$) of the bumps to the thickness ($T_A$) of the resin composition layer 16 is 1.0/0.8 to 1.0/1.8, and preferably 1.0/1.0 to 1.0/1.5 to suppress the generation of voids and to cover the circuit surface. The average height ($H_B$) of the bumps is the height from the chip surface (the circuit surface excluding the bumps) to the top of the bump, and when there are a plurality of bumps, the height is based on the arithmetical mean thereof.

When the height of the bump is too high relative to the thickness of the resin composition layer 16, the chip surface (the circuit surface excluding the bumps) and the substrate for loading the chip is spaced apart from one another, thereby causing the generation of voids. When the resin composition layer is too thick, the bump does not penetrate through the resin composition layer, thereby causing poor conductivity.

(Method of Manufacturing Laminated Sheet)

The laminated sheet 11 according to the present embodiment can be produced as follows for example.

First, the base 12 can be formed with a conventionally known film forming method. Examples of the film forming method include a calendar film-forming method, a casting method in an organic solvent, an inflation extruding method in a closed system, a T-die extruding method, a co-extruding method, and a dry laminating method.

Then, a pressure-sensitive adhesive composition solution, which is a material for forming the pressure-sensitive adhesive layer 14, is coated onto the base 12 to form a coating film, and the coating film is dried under a prescribed condition (crosslinked by heating as necessary) to form the pressure-sensitive adhesive layer 14. The coating method is not particularly limited. Examples include roll coating, screen coating, and gravure coating. The drying is performed at a drying temperature of 80 to 150° C. and a drying time of 0.5 to 5 minutes for example. The pressure-sensitive adhesive composition may be coated onto a separator to form a coating film, and then the coating film may be dried in the above-described drying condition to form the pressure-sensitive adhesive layer 14. After that, the pressure-sensitive adhesive layer 14 is pasted on the base 12 together with the separator. With this, the back grinding tape 11 is produced.

The resin composition layer 16 can be produced as follows for example.

First, a pressure-sensitive adhesive composition solution, which is a material for forming the resin composition layer 16, is produced. The binder resin having pressure-sensitive tackiness at a normal temperature, the thermosetting resin, the curing accelerator, and the like are compounded in the pressure-sensitive adhesive composition, as described above.

Then, a pressure-sensitive adhesive composition solution is coated onto a base separator to form a coating film having a prescribed thickness, and the coating film is then dried under a prescribed condition to form the resin composition layer 16 (pressure-sensitive adhesive layer). The coating method is not particularly limited. Examples include roll coating, screen coating, and gravure coating. The drying is performed at a drying temperature of 70 to 160° C. and a drying time of 1 to 5 minutes for example. The pressure-sensitive adhesive composition may be coated onto a separator to form a coating film, and then the coating film may be dried in the above-described drying condition to form the resin composition layer 16. After that, the resin composition layer 16 is pasted on the base separator together with the separator.

Then, the separator is peeled from each of the back grinding tape 11 and the resin composition layer 16, and the resin composition layer 16 is pasted to the back grinding tape 11 so as to face the pressure-sensitive adhesive layer 14 of the back grinding tape 11. Examples of a method of pasting the back grinding tape 11 and the resin composition layer 16 include a pressing method and a laminating method. However, the laminating method is preferable when productivity is considered. The laminating temperature is not particularly limited. However, it is preferably 30 to 90° C., and more preferably 60 to 80° C. The line pressure is not particularly limited. However, it is preferably 0.1 to 20 kgf/cm², and more preferably 1 to 10 kgf/cm². With this, the laminated sheet 10 according to the present embodiment can be obtained.

(Manufacturing of Semiconductor Device)

The method of manufacturing a semiconductor device is then described. FIGS. 2 to 9 are schematic sectional views showing one example of a method of manufacturing a semiconductor device using the laminated sheet 10. First, the resin composition layer 16 surface of the laminated sheet 10 is pasted to the circuit surface of a semiconductor wafer 40 to obtain the semiconductor wafer with the laminated sheet (refer to FIG. 2). The present step is performed while pressing with a pressing unit such as a press bonding roll. The pasting temperature during mounting is not particularly limited. However, it preferably ranges from 20 to 100° C.

Figure 3:
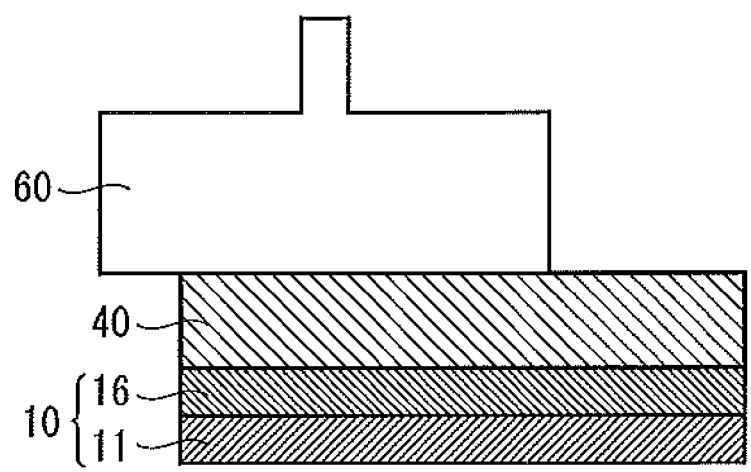
FIG. 3 is a schematic sectional view showing one example of a method of manufacturing a semiconductor device using the laminated sheet shown in FIG. 1.

Next, the surface where the laminated sheet 10 of the semiconductor wafer 40 with the laminated sheet 10 is not pasted is ground to make the semiconductor wafer 40 with the laminated sheet 10 thin (refer to FIG. 3). A normal method can be adopted for the thinning process. Examples of the machine 60 for the thinning process include a grinding machine (back grinding) and a CMP pad. The thinning process is performed until the semiconductor wafer has the desired thickness.

Figure 4:
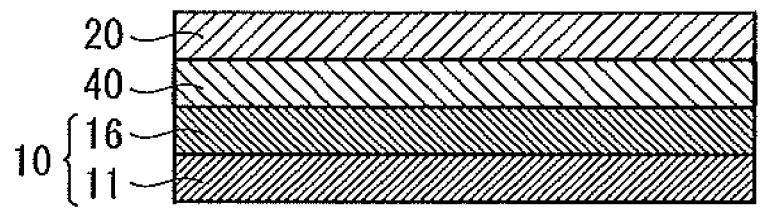
FIG. 4 is a schematic sectional view showing one example of a method of manufacturing a semiconductor device using the laminated sheet shown in FIG. 1.

The dicing tape 20 is then pasted to the ground surface of the thin semiconductor wafer 40 with the laminated sheet 10 to obtain the semiconductor wafer 40 in which the dicing tape 20 and the laminated sheet 10 are pasted together (refer to FIG. 4). Examples of a method of pasting the ground surface of the thin semiconductor wafer 40 and the dicing tape 20 include a pressing method and a laminating method. However, the laminating method is preferable when productivity is considered. The laminating temperature is not particularly limited. However, it is preferably 30 to 50° C., and more preferably 35 to 45° C. The line pressure is not particularly limited. However, it is preferably 0.1 to 20 kgf/cm², and more preferably 1 to 10 kgf/cm². A conventionally known dicing tape having a base and a pressure-sensitive adhesive layer can be adopted as the dicing tape 20. A general pressure-sensitive adhesive such as an acrylic pressure-sensitive adhesive and a rubber pressure-sensitive adhesive can be adopted as the pressure-sensitive adhesive layer that configures the dicing tape 20, and an ultraviolet-ray curable-type pressure-sensitive adhesive layer may be adopted.

Figure 5:
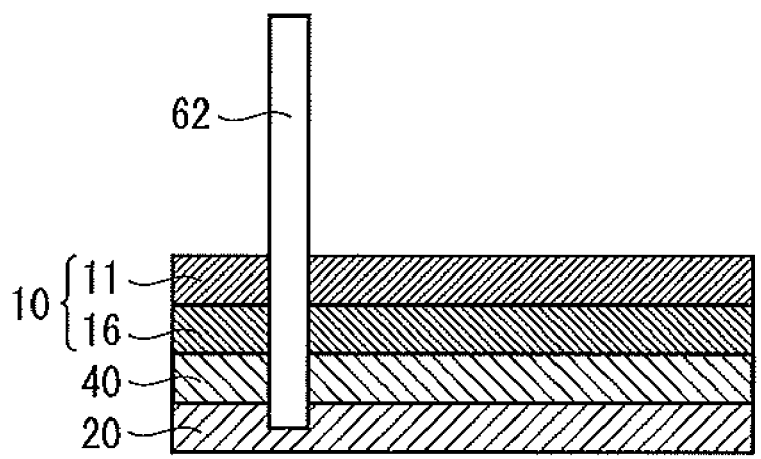
FIG. 5 is a schematic sectional view showing one example of a method of manufacturing a semiconductor device using the laminated sheet shown in FIG. 1.

Then, the semiconductor wafer 40 in which the dicing tape 20 and the laminated sheet 10 are pasted together is diced from the laminated sheet 10 side using a dicing blade 62 (refer to FIG. 5). With this, the semiconductor wafer 40 is cut into individual pieces having a prescribed size to obtain semiconductor chips 42. In this step, a cutting method called full cutting can be adopted in which the cutting is performed to reach the dicing tape 20. The dicing apparatus used in this step is not particularly limited, and a conventionally known method can be used. Because dicing is performed while the back grinding tape 11 is pasted onto the resin composition layer 16 in the present embodiment, the absorption of water by the resin composition layer 16 during dicing and the attachment of the cut scraps to the resin composition layer 16 can be suppressed. As a result, the decrease in adhering strength of the resin composition layer 16 and the deterioration in electrical reliability can be prevented. In this step, the laminated sheet 10 is also cut into individual chip pieces together with the semiconductor wafer 40.

The pressure-sensitive adhesive tape 30 is then pasted to the laminated sheet 10 (refer to FIG. 6). The pressure-sensitive adhesive tape 30 is pasted so as to cover a plurality of the laminated sheets 10 that are individualized into chip pieces. A conventional known pressure-sensitive adhesive tape can be adopted as the pressure-sensitive adhesive tape 30 as long as the tape has a higher adhering strength between the pressure-sensitive adhesive tape 30 and the base 12 than the adhering strength between the pressure-sensitive adhesive layer 14 and the resin composition layer 16.

Next, the pressure-sensitive adhesive tape 30 is peeled from the resin composition layer 16 together with the back grinding tape 11 (refer to FIG. 7). Because the back grinding tape 11 is individualized by dicing, a plurality of individualized back grinding tapes 11 are peeled from the resin composition layer 16 together with the pressure-sensitive adhesive tape 30 collectively.

When the pressure-sensitive adhesive layer of the dicing tape 20 is an ultraviolet-radiation curable type, the dicing tape 20 is irradiated with ultraviolet radiation to decrease adhesive power of the pressure-sensitive adhesive layer.

Figure 8:
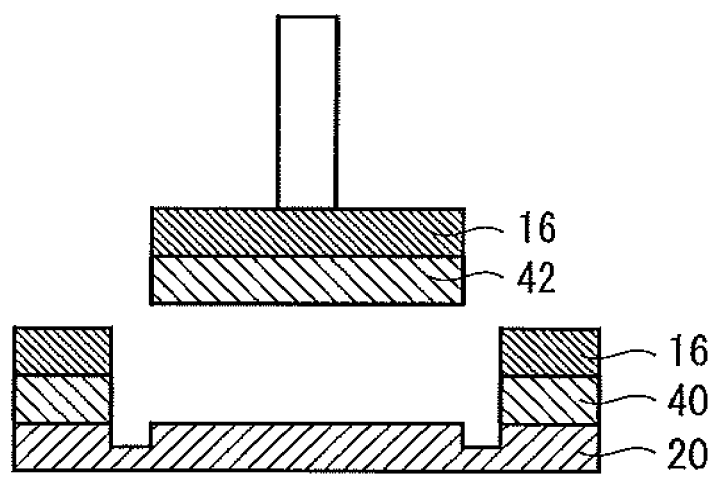
FIG. 8 is a schematic sectional view showing one example of a method of manufacturing a semiconductor device using the laminated sheet shown in FIG. 1.

Then, a pickup (releasing) of the semiconductor chip 42 is performed to release the semiconductor chip that is obtained by dicing (refer to FIG. 8). The method of pickup is not particularly limited, and various conventionally known methods can be adopted. Examples include a method of pushing up an individual semiconductor chip 42 from the dicing tape 20 side to pick up the pushed semiconductor chip 42 with a pickup apparatus.

Figure 9:
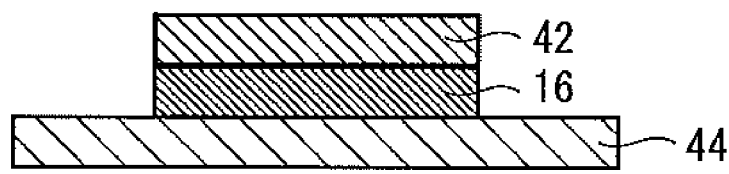
FIG. 9 is a schematic sectional view showing one example of a method of manufacturing a semiconductor device using the laminated sheet shown in FIG. 1.

As shown in FIG. 9, the picked up semiconductor chip 42 is adhered and fixed to an adherend 44 via the resin composition layer 16 therebetween with a flip-chip bonding method (a flip-chip mounting method) (flip-chip bonding step). Specifically, the semiconductor chip 42 is fixed to the adherend 44 with a normal method in a configuration in which the circuit surface of the semiconductor chip 42 (also referred to as a surface, a circuit pattern forming surface, an electrode forming surface, and the like) is facing the adherend 44. For example, a conductive material (not shown) for bonding that is adhered to a connecting pad of the adherend 44 is melted while the bumps (not shown) that are formed on the circuit surface of the semiconductor chip 42 are contacted and pressed into the conductive material, thereby making it possible to secure the electrical conductivity between the semiconductor chip 42 and the adherend 44 and to fix the semiconductor chip 42 to the adherend 44. The resin composition layer 16 is arranged in the space between the semiconductor chip 42 and the adherend 44. That is, when the semiconductor chip 42 is loaded, the space between the semiconductor chip 42 and the adherend 44 can be filled with the resin composition layer 16, and the semiconductor chip 42 and the adherend 44 can be adhered to each other with the resin composition layer 16.

Various substrates such as a lead frame and a circuit board (wire circuit board and the like) can be used as the adherend 44. The material of such substrates is not particularly limited. However, examples include a ceramic substrate and a plastic substrate. Examples of the plastic substrate include an epoxy substrate, a bismaleimide triazine substrate, and a polyimide substrate.

The material of the bumps and the conductive material are not particularly limited. However, examples include solders (alloy) such as a tin-lead based metal, a tin-silver based metal, a tin-silver-copper based metal, a tin-zinc based metal and a tin-zinc-bismuth based metal, a gold based metal, and a copper based metal.

Then, the resin composition layer 16 that is arranged between the flip-chip bonded semiconductor chip 42 and the adherend 44 is thermally cured. The curing process can be performed at 165° C. to 185° C. for about a few minutes to 1 hour.

<Second Aspect>

The points of the second aspect that differ from those of the first aspect are described below. The second aspect has the same configuration as that of the first aspect except for the items that are described in the present section "<Second Aspect>."

Figure 10:
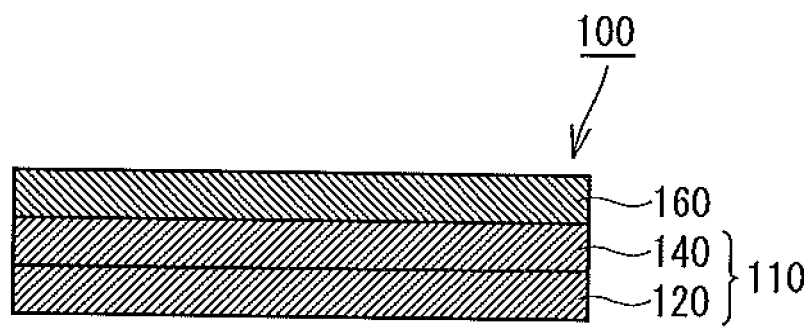
FIG. 10 is a schematic sectional view showing a laminated sheet according to one embodiment of a second aspect.
Figure 11:
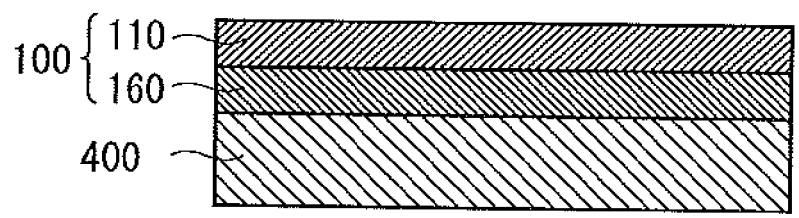
FIG. 11 is a schematic sectional view showing one example of a method of manufacturing a semiconductor device using the laminated sheet shown in FIG. 10.

An embodiment of the second aspect is described referring to the drawings. However, the second aspect is not limited to these examples. FIG. 10 is a schematic sectional view showing a laminated sheet according to one embodiment of the second aspect. In the drawings, the parts are omitted that are unnecessary for the description, and some parts are enlarged, shrunken, and the like to aid in the description.

<Laminated Sheet>

A laminated sheet 100 has a back grinding tape 110 in which a pressure-sensitive adhesive layer 140 is formed on a base 120, and a resin composition layer 160 that is provided on the pressure-sensitive adhesive layer 140 of the back grinding tape 110.

The laminated sheet 100, in which the pressure-sensitive adhesive layer 140 is formed from a radiation curable-type pressure-sensitive adhesive, can be used in any of the following methods (1) to (4) of manufacturing a semiconductor device.

1. A method of manufacturing a semiconductor device including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, pasting a pressure-sensitive adhesive tape to the laminated sheet after dicing, and peeling the pressure-sensitive adhesive tape from the resin composition layer together with the back grinding tape.

2. A method of manufacturing a semiconductor device including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, irradiating the laminated sheet side with radiation after dicing, pasting a pressure-sensitive adhesive tape to the laminated sheet after irradiating with radiation, and peeling the pressure-sensitive adhesive tape from the resin composition layer together with the back grinding tape.

3. A method of manufacturing a semiconductor device including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, pasting a pressure-sensitive adhesive tape to the laminated sheet after dicing, irradiating the laminated sheet side with radiation after pasting of the pressure-sensitive adhesive tape, and peeling the pressure-sensitive adhesive tape from the resin composition layer together with the back grinding tape.

4. A method of manufacturing a semiconductor device including the steps of pasting the resin composition layer surface of the laminated sheet to the circuit surface of a semiconductor wafer to obtain a semiconductor wafer with a laminated sheet, grinding the surface, where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, irradiating the laminated sheet side with radiation after dicing, pasting a pressure-sensitive adhesive tape to the laminated sheet after irradiating with radiation, irradiating the laminated sheet side with radiation after pasting of the pressure-sensitive adhesive tape, and peeling the pressure-sensitive adhesive tape from the resin composition layer together with the back grinding tape.

(Base)

A base that is described in the section of "<First Aspect>" such as the base 12 can be used as the base 120. Therefore, a detailed description of the base 120 is omitted here.

(Pressure-Sensitive Adhesive Layer)

The pressure-sensitive adhesive layer 140 contains a radiation curable-type pressure-sensitive adhesive. The adhesive power of the radiation curable-type pressure-sensitive adhesive can be easily decreased when the degree of crosslinking is increased by irradiation with radiation such as an ultraviolet ray. For example, by irradiating with radiation a portion of the pressure-sensitive adhesive layer 140 where the resin composition layer is pasted, a difference in adhesive power from another portion can be provided.

The portion of the pressure-sensitive adhesive layer 140 that is formed with an uncured radiation curable-type pressure-sensitive adhesive that is not irradiated with radiation adheres to the resin composition layer 160, and holding power can be secured during back grinding and dicing of the semiconductor wafer. In this way, the radiation curable-type pressure-sensitive adhesive can support the resin composition layer 160 for fixing the semiconductor chip to the adherend such as a substrate with a good balance of adhesion and releasing.

The radiation curable-type pressure-sensitive adhesive having an radiation curable type functional group such as a carbon-carbon double bond and exhibiting adherability can be used without special limitation. An example of the radiation curable-type pressure-sensitive adhesive is an addition-type radiation curable-type pressure-sensitive adhesive in which radiation curable type monomer and oligomer components are compounded into a general pressure-sensitive adhesive such as an acrylic pressure-sensitive adhesive or a rubber pressure-sensitive adhesive. The pressure-sensitive adhesive is preferably an acrylic pressure-sensitive adhesive containing an acrylic polymer as a base polymer for clean washing of electronic components such as a semiconductor wafer and glass, which are easily damaged by contamination, with ultra-pure water or an organic solvent such as alcohol.

Specific examples of the acrylic polymers include an acrylic polymer in which acrylate is used as a main monomer component. Examples of the acrylate include alkyl acrylate (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and cycloalkyl acrylate (for example, cyclopentylester, cyclohexylester, etc.). These monomers may be used alone or two or more types may be used in combination.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl (meth)acrylate, carboxypentyl (meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth) acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% or less by weight of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth) acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

Preparation of the above acrylic polymer can be performed by applying an appropriate manner such as solution polymerization, emulsion polymerization, bulk polymerization, and suspension polymerization to a mixture of one or two or more kinds of component monomers for example. Since the adhesive layer preferably has a composition in which the content of low molecular weight materials is suppressed for prevention of wafer contamination, and since those in which an acrylic polymer having a weight average molecular weight of 300000 g/mol or more, particularly 400000 to 3000000 g/mol as a main component are preferable for such purpose, the adhesive can be made to be an appropriate cross-linked type adhesive, such as an adhesive with internal cross-linking, an adhesive with external cross-linking, etc.

To increase the number-average molecular weight of the base polymer such as acrylic polymer etc., an external crosslinking agent can be suitably adopted in the adhesive. The external crosslinking method is specifically a reaction method that involves adding and reacting a crosslinking agent such as a polyisocyanate compound, epoxy compound, aziridine compound, melamine crosslinking agent, urea resin, anhydrous compound, or polyamine, to a carboxyl group-containing polymer. When the external crosslinking agent is used, the amount of the crosslinking agent to be used is determined suitably depending on a balance with the base polymer to be crosslinked and applications thereof as the adhesive. Generally, the crosslinking agent is preferably incorporated in an amount of about 5 parts by weight or less based on 100 parts by weight of the base polymer. The lower limit of the crosslinking agent is preferably 0.1 parts by weight or more. The adhesive may be blended not only with the components described above but also with a wide variety of conventionally known additives such as a tackifier, and an aging inhibitor, if necessary.

Examples of the radiation curable type monomer component to be compounded include components such as an urethane oligomer, urethane(meth)acrylate, trimethylolpropane tri(meth)acrylate, tetramethylolmethane tetra(meth)acrylate, pentaerythritol tri(meth)acrylate, pentaerythritol tetra(meth) acrylate, dipentaerythritol monohydroxypenta(meth)acrylate, dipentaerythritol hexa(meth)acrylate, and 1,4-butane dioldi(meth)acrylate. Further, the radiation curable type oligomer component includes various types of oligomers such as an urethane based, a polyether based, a polyester based, a polycarbonate based, and a polybutadiene based oligomer, and its molecular weight is appropriately in a range of about 100 to 30,000 g/mol. The compounding amount of the radiation curable type monomer component and the oligomer component can be appropriately determined to an amount in which the adhesive strength of the adhesive layer can be decreased depending on the type of the adhesive layer. Generally, it is for example 5 to 500 parts by weight, and preferably about 40 to 150 parts by weight based on 100 parts by weight of the base polymer such as an acrylic polymer constituting the adhesive.

Further, besides the addition-type radiation curable-type pressure-sensitive adhesive described above, the radiation curable-type pressure-sensitive adhesive includes an intrinsic-type radiation curable-type pressure-sensitive adhesive using an acrylic polymer having a radical reactive carbon-carbon double bond in the polymer side chain, in the main chain, or at the end of the main chain as the base polymer. The intrinsic-type radiation curable-type pressure-sensitive adhesives are preferable because they do not have to contain the oligomer component, etc. that is a low molecular weight component, or most of them do not contain the oligomer component, and they can form an adhesive layer having a stable layer structure without the oligomer component, etc. migrating in the adhesive over time.

The above-mentioned base polymer, which has a carbon-carbon double bond, may be any polymer that has a carbon-carbon double bond and further is viscous. As such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant to condensation-react or addition-react with a compound having a functional group reactive with the above-mentioned functional group and a carbon-carbon double bond while keeping the ultraviolet ray curability of the carbon-carbon double bond.

Examples of the combination of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable for ease of reaction tracing. If the above-mentioned acrylic polymer, which has a carbon-carbon double bond, can be produced by the combination of these functional groups, each of the functional groups may be present on any one of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The used acrylic polymer may be an acrylic polymer copolymerized with any one of the hydroxyl-containing monomers exemplified above, or an ether compound such as 2-hydroxyethyl vinyl ether, 4-hydroxybutyl vinyl ether or diethylene glycol monovinyl ether.

The intrinsic type radiation curable-type pressure-sensitive adhesive may be made only of the above-mentioned base polymer (in particular, the acrylic polymer), which has a carbon-carbon double bond. However, the above-mentioned radiation curable type monomer component or oligomer component may be incorporated into the base polymer to such an extent that properties of the adhesive are not deteriorated. The amount of the radiation curable type oligomer component or the like is usually 30 parts or less by weight, preferably from 0 to 10 parts by weight for 100 parts by weight of the base polymer.

In the case that the radiation curable-type pressure-sensitive adhesive is cured with ultraviolet rays or the like, a photopolymerization initiator is incorporated into the adhesive. Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl) oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

Examples of the radiation curable-type pressure-sensitive include a rubber adhesive and an acrylic adhesive, that are disclosed in Japanese Patent Application Laid-Open No. 60-196956, containing an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine, or an onium salt compound.

The thickness of the pressure-sensitive adhesive layer 140 is not particularly limited. However, it is preferably about 1 to 50 μm for preventing a chip cutting surface from being cracked and also fitting and holding the resin composition layer 160. It is more preferably 2 to 30 μm, and further preferably 5 to 25 μm.

The tensile modulus of the pressure-sensitive adhesive layer 140 before radiation curing at 23° C. is preferably 0.1 to 5.0 MPa, and more preferably 0.1 to 1.0 MPa. When the tensile modulus of the pressure-sensitive adhesive layer 140 before radiation curing at 23° C. is 0.1 to 5.0 MPa, chip flying from the back grinding tape 110 during dicing can be suppressed.

When the pressure-sensitive adhesive layer 140 is used in the method (1) of manufacturing a semiconductor device, the T-peeling strength between the pressure-sensitive adhesive layer 140 and the resin composition layer 160 before radiation curing is 0.1 to 5 N/20 mm or more, preferably 0.3 to 5.0 N/20 mm, and more preferably 0.5 to 5.0 N/20 mm, at 23° C. and 300 mm/min. Because the T-peeling strength between the pressure-sensitive adhesive layer 140 and the resin composition layer 160 before radiation curing is 0.1 N/20 mm or more at 23° C. and 300 mm/min, chip flying from the back grinding tape 110 during dicing can be suppressed.

When the pressure-sensitive adhesive layer 140 is used in any of the methods (2) to (4) of manufacturing a semiconductor device, the T-peeling strength between the pressure-sensitive adhesive layer 140 and the resin composition layer 160 before radiation curing is 0.1 to 20 N/20 mm or more, preferably 0.3 to 5.0 N/20 mm, and more preferably 0.5 to 5.0 N/20 mm, at 23° C. and 300 mm/min. Because the T-peeling strength between the pressure-sensitive adhesive layer 140 and the resin composition layer 160 before radiation curing is 0.1 N/20 mm or more at 23° C. and 300 mm/min, chip flying from the back grinding tape 110 during dicing can be suppressed.

When the pressure-sensitive adhesive layer 140 is used in any of the methods (2) to (4) of manufacturing a semiconductor device, the T-peeling strength between the pressure-sensitive adhesive layer 140 and the resin composition layer 160 after radiation curing is 0.01 to 5 N/20 mm or more, preferably 0.01 to 1.0 N/20 mm, and more preferably 0.01 to 0.5 N/20 mm, at 23° C. and 300 mm/min. Because the T-peeling strength after radiation curing is 5 N/20 mm or less, the pressure-sensitive adhesive tape 30 can be peeled from the resin composition layer 160 together with the back grinding tape 110 collectively.

(Resin Composition Layer)

A resin composition layer that is described in the section of "<First Aspect>" such as the resin composition layer 16 can be used as the resin composition layer 160. Therefore, a detailed description of the resin composition layer 160 is omitted here.

(Method of Manufacturing Laminated Sheet)

A method of manufacturing laminated sheet that is described in the section of "<First Aspect>" can be used as the method of manufacturing laminated sheet 100. Therefore, a detailed description of the method of manufacturing laminated sheet 100 is omitted here.

(Method of Manufacturing Semiconductor Device)

A method of manufacturing a semiconductor device is described. FIGS. 11 to 20 are schematic sectional views showing one example of a method of manufacturing a semiconductor device using the laminated sheet 100. First, the resin composition layer 160 surface of the laminated sheet 100 is pasted to the circuit surface of the semiconductor wafer 400 to obtain a semiconductor wafer with a laminated sheet (refer to FIG. 11). The present step is performed while pressing with a pressing unit such as a press bonding roll. The pasting temperature during mounting is not particularly limited. However, it preferably ranges from 20 to 100° C.

Figure 12:
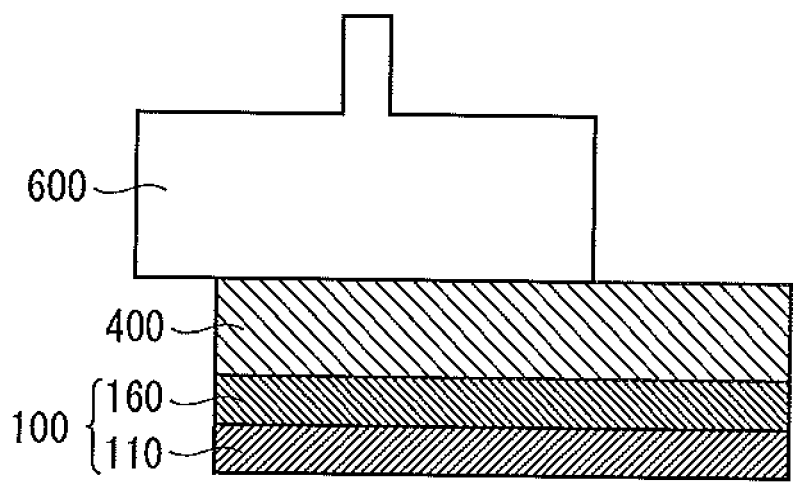
FIG. 12 is a schematic sectional view showing one example of a method of manufacturing a semiconductor device using the laminated sheet shown in FIG. 10.

Then, the surface where the laminated sheet 100 of the semiconductor wafer 400 with the laminated sheet 100 is not pasted is ground to make the semiconductor wafer 400 with the laminated sheet 100 thin (refer to FIG. 12). A normal method can be adopted for the thinning process. Examples of the machine 600 for the thinning process include a grinding machine (back grinding) and a CMP pad. The thinning process is preformed until the semiconductor wafer has the desired thickness.

Figure 13:
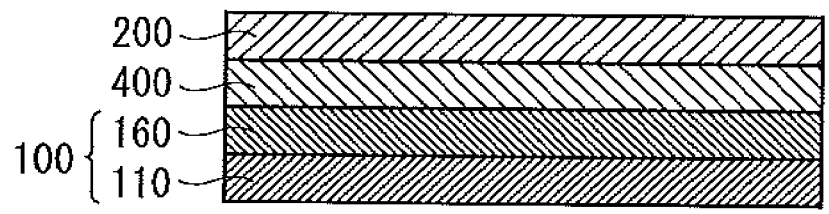
FIG. 13 is a schematic sectional view showing one example of a method of manufacturing a semiconductor device using the laminated sheet shown in FIG. 10.

The dicing tape 200 is then pasted to the ground surface of the thin semiconductor wafer 400 with the laminated sheet 100 to obtain the semiconductor wafer 400 in which the dicing tape 200 and the laminated sheet 100 are pasted together (refer to FIG. 13). Examples of a method of pasting the ground surface of the thin semiconductor wafer 400 and the dicing tape 200 include a pressing method and a laminating method. However, the laminating method is preferable when productivity is considered. The laminating temperature is not particularly limited. However, it is preferably 30 to 50° C., and more preferably 35 to 45° C. The line pressure is not particularly limited. However, it is preferably 0.1 to 20 kgf/cm², and more preferably 1 to 10 kgf/cm². A conventionally known dicing tape having a base and a pressure-sensitive adhesive layer can be adopted as the dicing tape 200. A general pressure-sensitive adhesive such as an acrylic pressure-sensitive adhesive and a rubber pressure-sensitive adhesive can be adopted as the pressure-sensitive adhesive layer that configures the dicing tape 200, and an ultraviolet-ray curable-type pressure-sensitive adhesive layer may be adopted.

Figure 14:
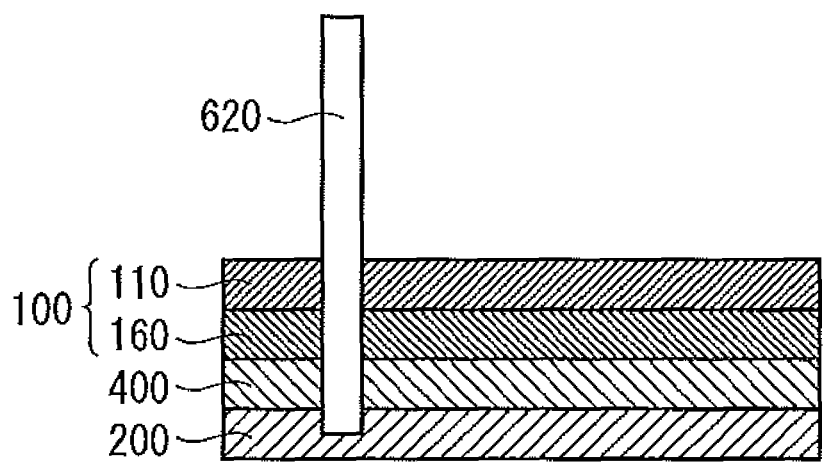
FIG. 14 is a schematic sectional view showing one example of a method of manufacturing a semiconductor device using the laminated sheet shown in FIG. 10.

Then, the semiconductor wafer 400 in which the dicing tape 200 and the laminated sheet 100 are pasted together is diced from the laminated sheet 100 side using a dicing blade 620 (refer to FIG. 14). With this, the semiconductor wafer 400 is cut into individual pieces having a prescribed size to obtain semiconductor chips 420. In this step, a cutting method called full cutting can be adopted in which the cutting is performed to reach the dicing tape 200. The dicing apparatus used in this step is not particularly limited, and a conventionally known method can be used. Because dicing is performed while the back grinding tape 110 is pasted onto the resin composition layer 160 in the present embodiment, the absorption of water by the resin composition layer 160 during dicing and the attachment of the cut scraps to the resin composition layer 160 can be suppressed. As a result, the decrease in adhering strength of the resin composition layer 160 and the deterioration in electrical reliability can be prevented. In this step, the laminated sheet 100 is also cut into individual chip pieces together with the semiconductor wafer 400.

Figure 15:
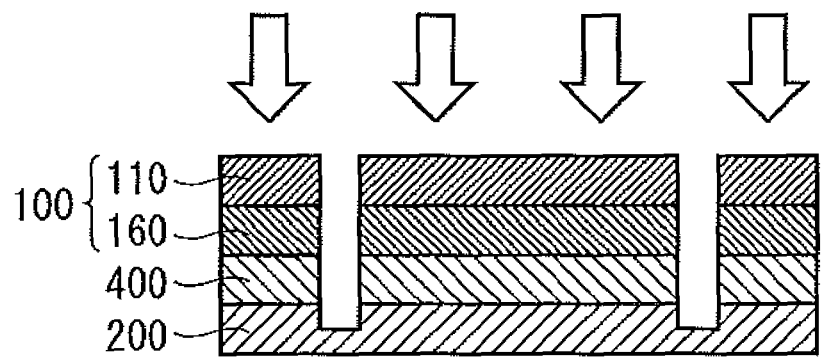
FIG. 15 is a schematic sectional view showing one example of a method of manufacturing a semiconductor device using the laminated sheet shown in FIG. 10.

The laminated sheet 100 side is irradiated with radiation as necessary (when the method (2) or (4) of manufacturing a semiconductor device is adopted) (refer to FIG. 15). With this, the pressure-sensitive adhesive layer 14 is cured and the adhesive power decreases. With respect to the irradiation amount of the radiation, for example, the irradiance of an ultraviolet ray at a wavelength of 10 to 400 nm is within a range from 10 to 1000 mW/cm² (preferably 20 to 200 mW/cm²) and the accumulative radiant exposure of the ultraviolet ray is within a range from 10 to 50 mJ/cm² (preferably 30 to 50 mJ/cm²). Specifically, for example, with respect to the irradiation with light by a high pressure mercury lamp, the irradiation conditions may be adopted such that the irradiance is within a range from 10 to 1000 mW/cm² (preferably 20 to 200 mW/cm²) and the accumulative radiant exposure of the ultraviolet ray is within a range from 10 to 50 mJ/cm² (preferably 30 to 50 mJ/cm²).

Figure 16:
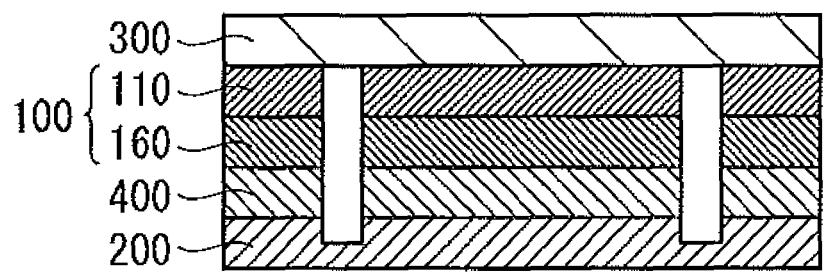
FIG. 16 is a schematic sectional view showing one example of a method of manufacturing a semiconductor device using the laminated sheet shown in FIG. 10.

The pressure-sensitive adhesive tape 300 is then pasted to the laminated sheet 100 (refer to FIG. 16). The pressure-sensitive adhesive tape 300 is pasted so as to cover a plurality of the laminated sheets 100 that are individualized into chip pieces. A conventional known pressure-sensitive adhesive tape can be adopted as the pressure-sensitive adhesive tape 300 as long as the tape has a higher adhering strength between the pressure-sensitive adhesive tape 300 and the base 120 than the adhering strength between the pressure-sensitive adhesive layer 140 and the resin composition layer 160.

Figure 17:
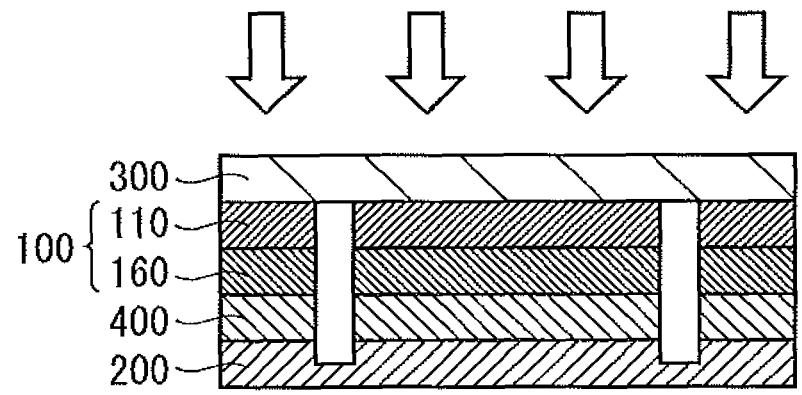
FIG. 17 is a schematic sectional view showing one example of a method of manufacturing a semiconductor device using the laminated sheet shown in FIG. 10.

The laminated sheet 100 side is irradiated with an ultraviolet ray as necessary (when the method (3) or (4) of manufacturing a semiconductor device is adopted) (refer to FIG. 17). With this, the pressure-sensitive adhesive layer 14 is cured and the adhesive power decreases. With respect to the irradiation amount of the radiation, for example, the irradiance of an ultraviolet ray at a wavelength of 10 to 400 nm is within a range from 10 to 1000 mW/cm² (preferably 20 to 200 mW/cm²) and the accumulative radiant exposure of the ultraviolet ray is within a range from 100 to 1000 mJ/cm² (preferably 400 to 1000 mJ/cm²). Specifically, for example, with respect to the irradiation with light by a high pressure mercury lamp, the irradiation conditions may be adopted that the irradiance is within a range from 10 to 1000 mW/cm² (preferably 20 to 200 mW/cm²) and the accumulative radiant exposure of the ultraviolet ray is within a range from 100 to 1000 mJ/cm² (preferably 400 to 1000 mJ/cm²).

Figure 18:
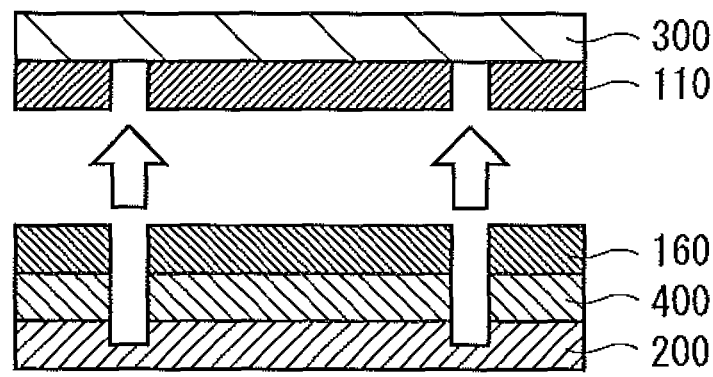
FIG. 18 is a schematic sectional view showing one example of a method of manufacturing a semiconductor device using the laminated sheet shown in FIG. 10.

Next, the pressure-sensitive adhesive tape 300 is peeled from the resin composition layer 160 together with the back grinding tape 110 (refer to FIG. 18). Because the back grinding tape 110 is individualized by dicing, a plurality of individualized back grinding tapes 110 are peeled from the resin composition layer 160 together with the pressure-sensitive adhesive tape 300 collectively.

When the pressure-sensitive adhesive layer of the dicing tape 200 is an ultraviolet-ray curable type, the dicing tape 200 is irradiated with an ultraviolet ray to decrease adhesive power of the pressure-sensitive adhesive layer.

Figure 19:
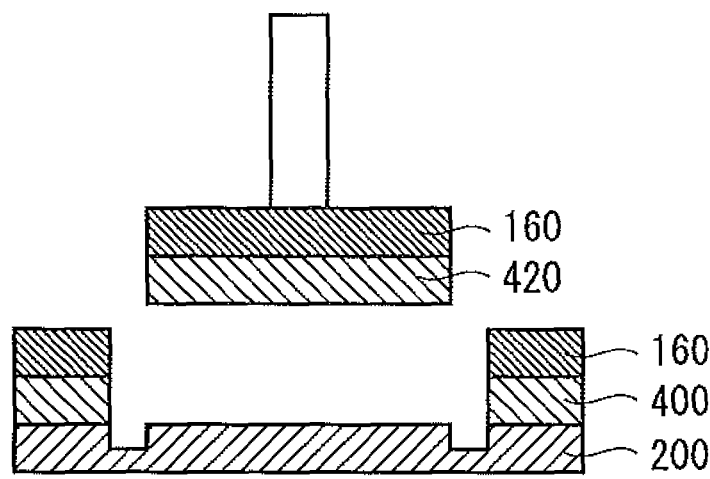
FIG. 19 is a schematic sectional view showing one example of a method of manufacturing a semiconductor device using the laminated sheet shown in FIG. 10.

Then, a pickup (releasing) of the semiconductor chip 420 is performed to release the semiconductor chip that is obtained by dicing (refer to FIG. 19). The method of pickup is not particularly limited, and various conventionally known methods can be adopted. Examples include a method of pushing up an individual semiconductor chip 420 from the dicing tape 200 side to pick up the pushed semiconductor chip 420 with a pickup apparatus.

Figure 20:
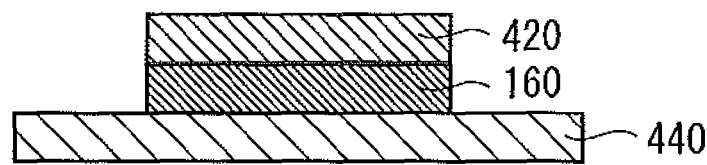
FIG. 20 is a schematic sectional view showing one example of a method of manufacturing a semiconductor device using the laminated sheet shown in FIG. 10.

As shown in FIG. 20, the picked up semiconductor chip 420 is adhered and fixed to an adherend 440 via the resin composition layer 160 therebetween with a flip-chip bonding method (a flip-chip mounting method) (flip-chip bonding step). Specifically, the semiconductor chip 420 is fixed to the adherend 440 with a normal method in a configuration in which the circuit surface of the semiconductor chip 420 (also referred to as a surface, a circuit pattern forming surface, an electrode forming surface, and the like) is facing the adherend 440. For example, a conductive material (not shown) for bonding that is adhered to a connecting pad of the adherend 440 is melted while the bumps (not shown) that are formed on the circuit surface of the semiconductor chip 420 are contacted and pressed into the conductive material, thereby making it possible to secure the electrical conductivity between the semiconductor chip 420 and the adherend 440 and to fix the semiconductor chip 420 to the adherend 440. The resin composition layer 160 is arranged in the space between the semiconductor chip 420 and the adherend 440. That is, when the semiconductor chip 420 is loaded, the space between the semiconductor chip 420 and the adherend 440 can be filled with the resin composition layer 160, and the semiconductor chip 420 and the adherend 440 can be adhered to each other with the resin composition layer 160.

Various substrates such as a lead frame and a circuit board (wire circuit board and the like) can be used as the adherend 440. The material of such substrates is not particularly limited. However, examples include a ceramic substrate and a plastic substrate. Examples of the plastic substrate include an epoxy substrate, a bismaleimide triazine substrate, and a polyimide substrate.

The material of the bumps and the conductive material are not particularly limited. However, examples include solders (alloy) such as a tin-lead based metal, a tin-silver based metal, a tin-silver-copper based metal, a tin-zinc based metal and a tin-zinc-bismuth based metal, a gold based metal, and a copper based metal.

Then, the resin composition layer 160 that is arranged between the flip-chip bonded semiconductor chip 420 and the adherend 440 is thermally cured. The curing process can be performed at 165° C. to 185° C. for about a few minutes to 1 hour.

In the method (2) of manufacturing a semiconductor device, the irradiation with an ultraviolet ray is performed after dicing, and the irradiation with an ultraviolet ray is not performed after pasting of the pressure-sensitive adhesive tape 300. The method (2) of manufacturing a semiconductor device is preferable in the respect that peeling power can be decreased when the pressure-sensitive adhesive tape is peeled from the resin composition layer together with the back grinding tape collectively and the peeling can be made easy.

In the method (3) of manufacturing a semiconductor device, the irradiation with an ultraviolet ray is not performed after dicing, and the irradiation with an ultraviolet ray is performed after pasting of the pressure-sensitive adhesive tape 300. The method (3) of manufacturing a semiconductor device is preferable in the respects that the adhesion power between the pressure-sensitive adhesive tape and the back grinding tape can be improved and that peeling power can be decreased when the pressure-sensitive adhesive tape is peeled from the resin composition layer together with the back grinding tape collectively and the peeling can be made easy.

In the method (4) of manufacturing a semiconductor device, the irradiation with an ultraviolet ray is performed after dicing, and the irradiation with an ultraviolet ray is performed also after pasting of the pressure-sensitive adhesive tape 300. The method (4) of manufacturing a semiconductor device is preferable in the respects that the adhesion power between the pressure-sensitive adhesive tape and the back grinding tape can be improved and that peeling power can be decreased when the pressure-sensitive adhesive tape is peeled from the resin composition layer together with the back grinding tape collectively and the peeling can be made easy.

A case in which the radiation is an ultraviolet ray is described in the above-described embodiment. However, the present invention is not limited to this example, and the radiation may be an x-ray, an electron beam, or the like. In this case, a pressure-sensitive adhesive corresponding to the radiation that is used such as an x-ray curable-type pressure-sensitive adhesive and an electron beam curable-type pressure-sensitive adhesive can be used.

EXAMPLES

Below, preferred examples of the present invention are explained in detail. However, materials, addition amounts, and the like described in these examples are not intended to limit the scope of the present invention, and are only examples for explanation and there is no description of limitations in particular. Further, "part" means "parts by weight."
[First Aspect]
The following respective examples correspond to the first aspect.
[Manufacturing of Resin Composition Layer]
The following epoxy resin, phenol resin, acrylic resin, and curing accelerator were prepared.

Epoxy resin A: Naphthalene type epoxy resin having an epoxy group equivalent of 142 g/eq (product name: HP4032D manufactured by DIC Corporation)

Epoxy resin B: Triphenol methane type epoxy resin having an epoxy group equivalent of 169 g/eq (product name: EPPN501HY manufactured by Nippon Kayaku Co., Ltd.)

Phenol novolak resin: Aralkyl type phenol resin having an epoxy group equivalent of 175 g/eq (product name: MEH-7800M/MEH-7800SS manufactured by Meiwa Plastic Industries, Ltd.)

Acrylic resin: Copolymer of ethylacrylate, butylacrylate, and acrylonitrile having a weight average molecular weight of 450,000 g/mol (product name: TEISAN RESIN SG-P3 manufactured by Nagase ChemteX Corporation)

Curing Accelerator: Triphenylphosphine (product name: TPP-K manufactured by Hokko Chemical Co., Ltd.)

Sixty parts of the epoxy resin A, 15 parts of the epoxy resin B, 90 parts of the phenol novolak resin, 115 parts of the acrylic resin, and 2 parts of the curing accelerator were mixed to obtained a resin composition. The resin composition was then coated to the surface of a release film (MRA manufactured by Mitsubishi Chemical Corporation, thickness 50 μm), that was subjected to a release treatment, so that the thickness after drying was 100 μm, and the resultant was dried at 110° C. for 5 minutes to obtain a resin composition layer.

Example 1

One hundred parts of 2-ethylhexylacrylate and 20 parts of 2-hydroxyethylacrylate were charged in a reactor equipped with a cooling tube, a nitrogen gas introducing tube, a thermometer, and a stirrer. A polymerization process was performed in a toluene solution in a nitrogen gas flow at 60° C. for 8 hours to obtain an acrylic polymer A.

Fifteen parts of a polyisocyanate crosslinking agent (trade name "Coronate X", manufactured by Nippon Polyurethane Industry Co., Ltd.) was added to 100 parts of the acrylic polymer A to obtain a pressure-sensitive adhesive composition solution A.

The pressure-sensitive adhesive composition solution A was coated on a PET film having a thickness of 50 μm, and dried by heating to form a pressure-sensitive adhesive layer A having a thickness of 30 μm. A tape in which the pressure-sensitive adhesive layer A was formed on the PET film was defined as a back grinding tape A.

Comparative Example 1

One hundred parts of butylacrylate, 80 parts of ethylacrylate, and 40 parts of 2-hydroxyethylacrylate were charged in a reactor equipped with a cooling tube, a nitrogen gas introducing tube, a thermometer, and a stirrer. A polymerization process was performed in a toluene solution in a nitrogen gas flow at 60° C. for 8 hours to obtain an acrylic polymer B.

Forty five parts of 2-methacryloyloxyethylisocyanate was added to the acrylic polymer B, and subjected to an addition polymerization reaction process in an air flow at 50° C. for 12 hours to obtain an acrylic polymer B'.

0.2 parts of a polyisocyanate crosslinking agent (trade name "Coronate L", manufactured by Nippon Polyurethane Industry Co., Ltd.) was added to 100 parts of the acrylic polymer B' to obtain a pressure-sensitive adhesive composition solution B.

The pressure-sensitive adhesive composition solution B was coated on a PET film having a thickness of 50 μm, and dried by heating to form a pressure-sensitive adhesive layer B having a thickness of 30 μm. A tape in which the pressure-sensitive adhesive layer B was formed on the PET film was defined as a back grinding tape B.

Comparative Example 2

One hundred parts of 2-ethylhexylacrylate and 20 parts of 2-hydroxyethylacrylate were charged in a reactor equipped with a cooling tube, a nitrogen gas introducing tube, a thermometer, and a stirrer. A polymerization process was performed in a toluene solution in a nitrogen gas flow at 60° C. for 8 hours to obtain an acrylic polymer C.

30 parts of a polyisocyanate crosslinking agent (trade name "Coronate X", manufactured by Nippon Polyurethane Industry Co., Ltd.) was added to 100 parts of the acrylic polymer C to obtain a pressure-sensitive adhesive composition solution C.

The pressure-sensitive adhesive composition solution C was coated on a PET film having a thickness of 50 μm, and dried by heating to form a pressure-sensitive adhesive layer C having a thickness of 30 μm. Thereafter, the pressure-sensitive adhesive layer C was irradiated with an ultraviolet ray of 400 mJ/cm² to obtain a back grinding tape C.

(Measurement of Tensile Modulus of Pressure-Sensitive Adhesive)

The tensile modulus of each of the pressure-sensitive adhesive layers A to C was measured. The tensile modulus was obtained from a value calculated from a tangent of a load-elongation curve measured with a Tensilon tensile tester (AGS-J manufactured by Shimadzu Corporation). The measurement conditions were as follows: a distance between chucks was 10 mm and a tensile speed was 50 mm/min. The result is shown in Table 1.

(Measurement of T-Peeling Strength between Pressure-Sensitive Adhesive Layer and Resin Composition Layer)

The pressure-sensitive adhesive surface of the back grinding tape A and the resin composition layer were pasted together under conditions of a pasting speed of 0.6 m/min, a roller temperature of 25° C., and a load of 0.5 MPa with a rubber laminating roller using a pasting apparatus manufactured by Taisho Laminator Co., Inc. to produce a laminated sheet A. The laminated sheet A was defined as a laminated sheet according to Example 1. The resin composition layer was pasted to each of the back grinding tapes B and C in the same manner to produce laminated sheets B and C. The laminated sheet B was defined as a laminated sheet according to Comparative Example 1. The laminated sheet C was defined as a laminated sheet according to Comparative Example 2.

The T-peeling strength between the pressure-sensitive adhesive layer of each of the laminated sheets A to C and the resin composition layer was measured with a Tensilon tensile tester (AGS-J manufactured by Shimadzu Corporation). The peeling speed was 300 mm/min. The result is shown in Table 1.

(Evaluation of Chip flying from Back Grinding Tape During Dicing)

The laminated sheets A to C were produced in the same manner as described above. The resin composition layer surface of the laminated sheet and the mirror surface of a wafer were pasted together under conditions of a pasting speed of 0.6 m/min, a roller temperature of 70° C., and a load of 0.5 MPa with a rubber laminating roller using a pasting apparatus manufactured by Taisho Laminator Co., Inc. A one-side mirror-finished 8 inch wafer manufactured by Synergy-Tech Co., Ltd. was used.

Then, the pasted laminated sheet was cut into a wafer shape, and the surface of the wafer with the laminated sheet was ground to a thickness of 200 μm using a back grinding machine manufactured by DISCO Corporation.

Then, the ground surface of the wafer with the laminated sheet and the pressure-sensitive adhesive surface of a dicing tape (DU-300 manufactured by Nitto Denko Corporation) were pasted together under conditions of a pasting speed of 0.6 m/min, a roller temperature of 25° C., and a load of 0.5 MPa with a rubber laminating roller using a pasting apparatus manufactured by Taisho Laminator Co., Inc.

Then, dicing was performed from the back grinding tape side first into the pressure-sensitive adhesive layer of the back grinding tape and then into the base film of the dicing tape at a spindle rotation of 40,000 rpm and a cutting speed of 30 mm/sec using a dicer manufactured by DISCO Corporation. The cases in which there was no chip flying from the back grinding tape during dicing were marked "O", and the cases in which there was chip flying were marked "x". The results are shown in Table 1.

(Evaluation of Peeling Property of Back Grinding Tape after Dicing)

After dicing, a pressure-sensitive adhesive tape (BT-315 manufactured by Nitto Denko Corporation) was pasted to the back grinding tape surface of the wafer with the dicing tape under conditions of a pasting speed of 0.6 m/min, a roller temperature of 25° C., and a load of 0.5 MPa with a rubber laminating roller using a pasting apparatus manufactured by Taisho Laminator Co., Inc. Then, the pressure-sensitive adhesive tape was pulled using a Tensilon tensile tester (AGS-J manufactured by Shimadzu Corporation) with a T-peeling method at a peeling speed of 300 mm/min. The cases in which the back grinding tape was peeled from the resin composition layer with a condition that it was pasted to the pressure-sensitive adhesive tape were marked "O", and the cases in which the back grinding tape was not peeled from the resin composition layer with a condition that it was pasted to the pressure-sensitive adhesive tape were marked "x". However, the laminated sheet C was not evaluated because chip flying from the back grinding tape occurred during dicing. The result is shown in Table 1.

TABLE 1

|  | Example 1 | Comparative Example 1 | Comparative Example 2 |
|---|---|---|---|
| Tensile Modulus [MPa] | 4.3 | 0.15 | 6.7 |
| T-Peeling Strength [N/20 mm] | 0.21 | 8.0 or more | 0.085 |
| Evaluation of Chip Flying from Back Grinding Tape During Dicing | O | O | X |
| Evaluation of Peeling Property of Back Grinding Tape | O | X | — |

[Second Aspect]

The following respective examples correspond to the second aspect.

[Manufacturing of Resin Composition Layer]

The following epoxy resin, phenol resin, acrylic resin, and curing accelerator were prepared.

Epoxy resin A: Naphthalene type epoxy resin having an epoxy group equivalent of 142 g/eq (product name: HP4032D manufactured by DIC Corporation)

Epoxy resin B: Triphenol methane type epoxy resin having an epoxy group equivalent of 169 g/eq (product name: EPPN501HY manufactured by Nippon Kayaku Co., Ltd.)

Phenol novolak resin: Aralkyl type phenol resin having an epoxy group equivalent of 175 g/eq (product name: MEH-7800M/MEH-7800SS manufactured by Meiwa Plastic Industries, Ltd.)

Acrylic resin: Copolymer of ethylacrylate, butylacrylate, and acrylonitrile having a weight average molecular weight of 450,000 g/mol (product name: TEISAN RESIN SG-P3 manufactured by Nagase ChemteX Corporation)

Curing Accelerator: Triphenylphosphine (product name: TPP-K manufactured by Hokko Chemical Co., Ltd.)

Sixty parts of the epoxy resin A, 15 parts of the epoxy resin B, 90 parts of the phenol novolak resin, 115 parts of the acrylic resin, and 2 parts of the curing accelerator were mixed to obtained a resin composition. The resin composition was then coated to the surface of a release film (MRA manufactured by Mitsubishi Chemical Corporation, thickness 50 μm), that was subjected to a release treatment, so that the thickness after drying was 100 μm, and the resultant was dried at 110° C. for 5 minutes to obtain a resin composition layer.

Example 1

One hundred parts of 2-ethylhexylacrylate and 20 parts of 2-hydroxyethylacrylate were charged in a reactor equipped with a cooling tube, a nitrogen gas introducing tube, a thermometer, and a stirrer. A polymerization process was performed in a toluene solution in a nitrogen gas flow at 60° C. for 8 hours to obtain an acrylic polymer A.

Fifteen parts of 2-methacryloyloxyethylisocyanate was added to the acrylic polymer A, and subjected to an addition polymerization reaction process in an air flow at 50° C. for 12 hours to obtain an acrylic polymer A'.

Then, 2 parts of a polyisocyanate crosslinking agent (product name "Coronate L", manufactured by Nippon Polyurethane Industry Co., Ltd.) and 2 parts of an acetophenone photopolymerization initiator (product name "Irgacure 651", manufactured by Chiba Specialty Chemicals Corporation) were added to 100 parts of the acrylic polymer A' to obtain a pressure-sensitive adhesive composition solution A.

The pressure-sensitive adhesive composition solution A was coated on a PET film having a thickness of 50 μm, and dried by heating to form a pressure-sensitive adhesive layer A having a thickness of 30 μm. A tape in which the pressure-sensitive adhesive layer A was formed on the PET film was defined as a back grinding tape A.

Example 2

The same back grinding tape as the back grinding tape A of Example 1 was defined as a back grinding tape B according to Example 2. The pressure-sensitive adhesive layer that configures the back grinding tape B was defined as a pressure-sensitive adhesive layer B. The back grinding tape B according to Example 2 was irradiated with an ultraviolet ray of 50 mJ/cm$^2$ after dicing and before pasting of the pressure-sensitive adhesive tape as described later, and used.

Example 3

The same back grinding tape as the back grinding tape A of Example 1 was defined as a back grinding tape C according to Example 3. The pressure-sensitive adhesive layer that configures the back grinding tape C was defined as a pressure-sensitive adhesive layer C. The back grinding tape C according to Example 3 was irradiated with an ultraviolet ray of 400 mJ/cm$^2$ after pasting of the pressure-sensitive adhesive tape as described later, and used.

Example 4

The same back grinding tape as the back grinding tape A of Example 1 was defined as a back grinding tape D according to Example 4. The pressure-sensitive adhesive layer that configures the back grinding tape D was defined as a pressure-sensitive adhesive layer D. The back grinding tape D according to Example 4 was irradiated with an ultraviolet ray of 50 mJ/cm$^2$ after dicing and before pasting of the pressure-sensitive adhesive tape, further irradiated with an ultraviolet ray of 400 mJ/cm$^2$ after pasting of the pressure-sensitive adhesive tape, and used.

Comparative Example 1

One hundred parts of butylacrylate, 80 parts of ethylacrylate, and 40 parts of 2-hydroxyethylacrylate were charged in a reactor equipped with a cooling tube, a nitrogen gas introducing tube, a thermometer, and a stirrer. A polymerization process was performed in a toluene solution in a nitrogen gas flow at 60° C. for 8 hours to obtain an acrylic polymer E.

Forty five parts of 2-methacryloyloxyethylisocyanate was added to the acrylic polymer E, and subjected to an addition polymerization reaction process in an air flow at 50° C. for 12 hours to obtain an acrylic polymer E'.

Then, 0.2 parts of a polyisocyanate crosslinking agent (Coronate L manufactured by Nippon Polyurethane Industry Co., Ltd.) and 3 parts of an acetophenone photopolymerization initiator (product name "Irgacure 651", manufactured by Chiba Specialty Chemicals Corporation) were added to 100 parts of the acrylic polymer E' to obtain a pressure-sensitive adhesive composition solution E.

The pressure-sensitive adhesive composition solution E was coated on a PET film having a thickness of 50 μm, and dried by heating to form a pressure-sensitive adhesive layer E having a thickness of 30 μm. A tape in which the pressure-sensitive adhesive layer E was formed on the PET film was defined as a back grinding tape E.

Comparative Example 2

The base film surface (PET film surface) side of the back grinding tape A of Example 1 was irradiated with an ultraviolet ray of 400 mJ/cm$^2$ using an UV irradiation apparatus (Nitto Seiki Co., Ltd.). This was defined as a back grinding tape F. The pressure-sensitive adhesive layer that configures the back grinding tape F was defined as a pressure-sensitive adhesive layer F.

Comparative Example 3

The same back grinding tape as the back grinding tape A of Example 1 was defined as a back grinding tape G according to Comparative Example 3. The pressure-sensitive adhesive layer that configures the back grinding tape G was defined as a pressure-sensitive adhesive layer G. The back grinding tape G according to Comparative Example 3 was irradiated with an ultraviolet ray of 400 mJ/cm$^2$ after dicing and before pasting of the pressure-sensitive adhesive tape as described later, and used.

(Measurement of Tensile Modulus of Pressure-Sensitive Adhesive)

The tensile modulus of each of the pressure-sensitive adhesive layers A to G was measured. The tensile modulus was obtained from a value calculated from a tangent of a load-elongation curve measured with a Tensilon tensile tester (AGS-J manufactured by Shimadzu Corporation). The measurement conditions were as follows: a distance between chucks was 10 mm and a tensile speed was 50 mm/min. The result is shown in Table 2.

(Measurement of T-Peeling Strength Between Pressure-Sensitive Adhesive Layer and Resin Composition Layer)

The pressure-sensitive adhesive surface of the back grinding tape A and the resin composition layer were pasted together under conditions of a pasting speed of 0.6 m/min, a roller temperature of 25° C., and a load of 0.5 MPa with a rubber laminating roller using a pasting apparatus manufactured by Taisho Laminator Co., Inc. to produce a laminated sheet A. The laminated sheet A was defined as a laminated sheet according to Example 1. The resin composition layer was pasted to each of the back grinding tapes B to G in the same manner to produce laminated sheets B to G. The laminated sheet B was defined as a laminated sheet according to Example 2. The laminated sheet C was defined as a laminated sheet according to Example 3. The laminated sheet D was defined as a laminated sheet according to Example 4. The laminated sheet E was defined as a laminated sheet according to Comparative Example 1. The laminated sheet F was defined as a laminated sheet according to Comparative Example 2. The laminated sheet G was defined as a laminated sheet according to Comparative Example 3.

The T-peeling strength between the pressure-sensitive adhesive layer of each of the laminated sheets A to G and the resin composition layer was measured with a Tensilon tensile tester (AGS-J manufactured by Shimadzu Corporation). The peeling speed was 300 mm/min. The result is shown in Table 2.

(Evaluation of Chip Flying from Back Grinding Tape During Dicing)

The laminated sheets A to G were produced in the same manner as described above. The resin composition layer surface of the laminated sheet and the mirror surface of a wafer were pasted together under conditions of a pasting speed of 0.6 m/min, a roller temperature of 70° C., and a load of 0.5 MPa with a rubber laminating roller using a pasting apparatus manufactured by Taisho Laminator Co., Inc. A one-side mirror-finished 8 inch wafer manufactured by Synergy-Tech Co., Ltd. was used.

Then, the pasted laminated sheet was cut into a wafer shape, and the surface of the wafer with the laminated sheet was ground to a thickness of 200 μm using a back grinding machine manufactured by DISCO Corporation.

Then, the ground surface of the wafer with the laminated sheet and the pressure-sensitive adhesive surface of a dicing tape (DU-300 manufactured by Nitto Denko Corporation) were pasted together under conditions of a pasting speed of 0.6 m/min, a roller temperature of 25° C., and a load of 0.5 MPa with a rubber laminating roller using a pasting apparatus manufactured by Taisho Laminator Co., Inc.

Then, dicing was performed from the back grinding tape side first into the pressure-sensitive adhesive layer of the back grinding tape and then into the base film of the dicing tape at a spindle rotation of 40,000 rpm and a cutting speed of 30 mm/sec using a dicer manufactured by DISCO Corporation. The cases in which there was no chip flying from the back grinding tape during dicing were marked "O", and the cases in which there was chip flying were marked "x". The result is shown in Table 2.

(Measurement of Tensile Modulus and T-Peeling Strength after Ultraviolet Ray Irradiation (1) was Performed after Dicing)

After dicing, the pressure-sensitive adhesive layer of each of the laminated sheets of Examples 2 and 4 and Comparative Example 3 was irradiated with an ultraviolet ray of an amount described in Table 2 (ultraviolet ray irradiation (1)). Thereafter, the tensile modulus of each pressure-sensitive adhesive layer was determined. Specifically, the tensile modulus was obtained from a value calculated from a tangent of a load-elongation curve measured with a Tensilon tensile tester (AGS-J manufactured by Shimadzu Corporation). The measurement conditions were as follows: a distance between chucks was 10 mm and a tensile speed was 50 mm/min. The results are shown in Table 2.

The T-peeling strength between the pressure-sensitive adhesive layer of each of the laminated sheets and the resin composition layer was measured with a Tensilon tensile tester (AGS-J manufactured by Shimadzu Corporation). The peeling speed was 300 mm/min. The result is shown in Table 2.

(Measurement of Tensile Modulus and Peeling Strength after Ultraviolet Ray Irradiation (2) was Performed after Pasting of Pressure-Sensitive Adhesive Tape)

After dicing, a pressure-sensitive adhesive tape (BT-315 manufactured by Nitto Denko Corporation) was pasted to the back grinding tape surface of the wafer with a dicing tape under conditions of a pasting speed of 0.6 m/min, a roller temperature of 25° C., and a load of 0.5 MPa with a rubber laminating roller using a pasting apparatus manufactured by Taisho Laminator Co., Inc. Then, the pressure-sensitive adhesive layer of each of the laminated sheets of Examples 3 and 4 was irradiated with an ultraviolet ray of an amount described in Table 2 (ultraviolet ray irradiation (2)). Thereafter, the tensile modulus of each pressure-sensitive adhesive layer was determined. Specifically, the tensile modulus was obtained from a value calculated from a tangent of a load-elongation curve measured by with a Tensilon tensile tester (AGS-J manufactured by Shimadzu Corporation). The measurement conditions were as follows: a distance between chucks was 10 mm and a tensile speed was 50 mm/min. The results are shown in Table 2.

The T-peeling strength between the pressure-sensitive adhesive layer of each of the laminated sheets and the resin composition layer was measured with a Tensilon tensile tester (AGS-J manufactured by Shimadzu Corporation). The peeling speed was 300 mm/min. The results are shown in Table 2.

(Evaluation of Peeling Property of Back Grinding Tape after Dicing)

After the ultraviolet ray irradiation (1) and/or the ultraviolet ray irradiation (2), the pressure-sensitive adhesive tape was pulled using a Tensilon tensile tester (AGS-J manufactured by Shimadzu Corporation) with a T-peeling method at a peeling speed of 300 mm/min. The cases in which the back grinding tape was peeled from the resin composition layer with a condition that it was pasted to the pressure-sensitive adhesive tape were marked "O", and the cases in which the back grinding tape was not peeled from the resin composition layer with a condition that it was pasted to the pressure-sensitive adhesive tape were marked "x". However, the laminated sheet F was not evaluated because chip flying from the back grinding tape occurred during dicing. The results are shown in Table 2.

TABLE 2

| | Example 1 | Example 2 | Example 3 | Example 4 | Comparative Example 1 | Comparative Example 2 | Comparative Example 3 |
|---|---|---|---|---|---|---|---|
| Tensile Modulus [MPa] | 0.17 | 0.17 | 0.17 | 0.17 | 0.15 | 7.4 | 0.17 |
| T-Peeling strength [N/20 mm] | 0.47 | 0.47 | 0.47 | 0.47 | 8.0 or more | 0.073 | 0.47 |

TABLE 2-continued

|  | Example 1 | Example 2 | Example 3 | Example 4 | Comparative Example 1 | Comparative Example 2 | Comparative Example 3 |
|---|---|---|---|---|---|---|---|
| Evaluation of Chip Flying from Back Grinding Tape During Dicing | ○ | ○ | ○ | ○ | ○ | X | ○ |
| Radiant Exposure [mJ/cm$^2$] of UV Irradiation (1) After Dicing | 0 | 50 | 0 | 50 | 0 | 0 | 400 |
| Tensile Modulus [MPa] After UV Irradiation (1) | 0.17 | 4.7 | 0.17 | 4.7 | 0.15 | 7.4 | 7.4 |
| T Peeling strength [N/20 mm] After UV Irradiation (1) | 0.47 | 0.2 | 0.47 | 0.2 | 8.0 or more | 0.073 | 0.073 |
| Radiant Exposure [mJ/cm$^2$] of UV Irradiation (2) After Pasting of Peeling Tape | 0 | 0 | 400 | 400 | 0 | 0 | 0 |
| Tensile Modulus [MPa] After UV Irradiation (2) | 0.17 | 4.7 | 7.4 | 7.4 | 0.15 | 7.4 | 7.4 |
| T-Peeling strength [N/20 mm] After UV Irradiation (2) | 0.47 | 0.2 | 0.073 | 0.073 | 8.0 or more | 0.073 | 0.073 |
| Evaluation of Peeling Property of Back Grinding Tape | ○ | ○ | ○ | ○ | X | X | X |

What is claimed is:

1. A method of manufacturing a semiconductor device using a laminated sheet having a back grinding tape in which a pressure-sensitive adhesive layer is formed on a base, and a resin composition layer that is provided on the pressure-sensitive adhesive layer of the back grinding tape, in which a tensile modulus of the pressure-sensitive adhesive layer at 23° C. is 0.1 to 5.0 MPa, and a T peeling strength between the pressure-sensitive adhesive layer and the resin composition layer is 0.1 to 5 N/20 mm at 23° C. and 300 mm/min, the method comprising the steps of:

pasting the resin composition layer surface of the laminated sheet to a circuit surface of a semiconductor wafer to obtain a semiconductor wafer with a laminated sheet, grinding a surface where the laminated sheet of the semiconductor wafer with the laminated sheet is not pasted, to make the semiconductor wafer with the laminated sheet thin, pasting a dicing tape to the ground surface of the thin semiconductor wafer with the laminated sheet to obtain a semiconductor wafer in which the dicing tape and the laminated sheet are pasted together, dicing the semiconductor wafer in which the dicing tape and the laminated sheet are pasted together from the laminated sheet side, pasting a pressure-sensitive adhesive tape to the laminated sheet after dicing, and peeling the pressure-sensitive adhesive tape from the resin composition layer together with the back grinding tape.

2. The method of manufacturing a semiconductor device according to claim 1, wherein the resin composition layer contains a thermosetting resin.

3. The method of manufacturing a semiconductor device according to claim 1, wherein the thermosetting resin is an epoxy resin.

* * * * *